(12) United States Patent
Onuki et al.

(10) Patent No.: US 9,854,146 B2
(45) Date of Patent: Dec. 26, 2017

(54) IMAGING APPARATUS WITH TWO IMAGE SENSORS

(71) Applicant: CANON KABUSHIKI KAISHA, Tokyo (JP)

(72) Inventors: Ichiro Onuki, Kawasaki (JP); Hirohito Kai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 14 days.

(21) Appl. No.: 15/159,673

(22) Filed: May 19, 2016

(65) Prior Publication Data

US 2016/0349522 A1    Dec. 1, 2016

(30) Foreign Application Priority Data

May 29, 2015   (JP) .................................. 2015-109420

(51) Int. Cl.

| | |
|---|---|
| *H04N 5/225* | (2006.01) |
| *H04N 5/357* | (2011.01) |
| *H04N 5/369* | (2011.01) |
| *H04N 5/374* | (2011.01) |
| *H04N 5/378* | (2011.01) |

(Continued)

(52) U.S. Cl.
CPC ........... *H04N 5/2258* (2013.01); *G03B 13/36* (2013.01); *H04N 5/3572* (2013.01); *H04N 5/3696* (2013.01); *H04N 5/374* (2013.01); *H04N 5/378* (2013.01); *G03B 17/14* (2013.01); *H04N 5/23212* (2013.01)

(58) Field of Classification Search
CPC ............. H04N 5/2258; H04N 5/23212; H04N 5/3696; H04N 5/374; H04N 5/3572; H01L 27/14627
See application file for complete search history.

(56) References Cited

U.S. PATENT DOCUMENTS

| | | | | |
|---|---|---|---|---|
| 5,815,748 A | * | 9/1998 | Hamamura | ............... G02B 7/28 |
| | | | | 348/345 |
| 2010/0097503 A1 | * | 4/2010 | Aragaki | ................... G02B 7/34 |
| | | | | 348/241 |

(Continued)

FOREIGN PATENT DOCUMENTS

| | | | | |
|---|---|---|---|---|
| JP | 2014122957 A | * | 7/2014 | |
| JP | 2014232137 A | * | 12/2014 | |
| JP | 2015-34917 A | | 2/2015 | |

*Primary Examiner* — Daniel M Pasiewicz
(74) *Attorney, Agent, or Firm* — Canon USA, Inc., IP Division

(57) ABSTRACT

A pair of pupil regions of an exit pupil, through which light beams received by a pair of photoelectric conversion units included in a pixel portion of a first image sensor respectively pass, are overlapped. A pair of pupil regions of an exit pupil, through which light beams received by a pair of photoelectric conversion units included in a pixel portion of a second image sensor respectively pass, are overlapped. A second base length, which is a distance between centroids of the pair of pupil regions corresponding to the pair of photoelectric conversion units included in the pixel portion of the second image sensor, is longer than a first base length, which is a distance between centroids of the pair of pupil regions corresponding to the pair of photoelectric conversion units included in the pixel portion of the first image sensor.

25 Claims, 20 Drawing Sheets

(51) Int. Cl.
*H04N 5/232* (2006.01)
*G03B 13/36* (2006.01)
*G03B 17/14* (2006.01)

(56) References Cited

U.S. PATENT DOCUMENTS

| | | | | |
|---|---|---|---|---|
| 2011/0273599 A1* | 11/2011 | Murata | ................... | G02B 7/36 348/294 |
| 2012/0044406 A1* | 2/2012 | Shimoda | ................ | G02B 7/365 348/345 |
| 2012/0212662 A1* | 8/2012 | Shimoda | ............ | H04N 5/23212 348/349 |
| 2013/0120644 A1* | 5/2013 | Fujii | ....................... | G02B 7/36 348/349 |
| 2014/0176785 A1* | 6/2014 | Sambonsugi | ...... | H04N 5/23212 348/350 |

* cited by examiner

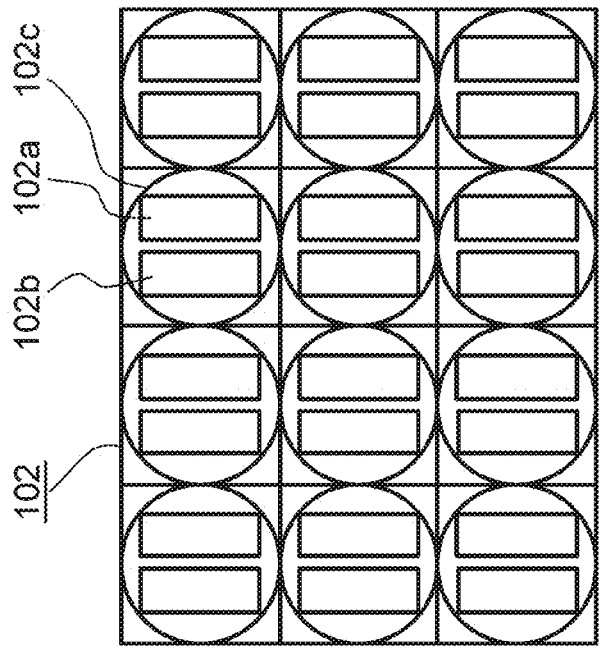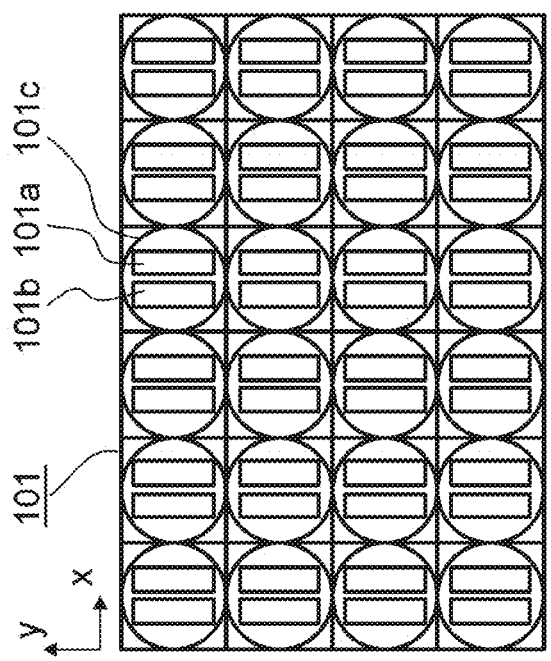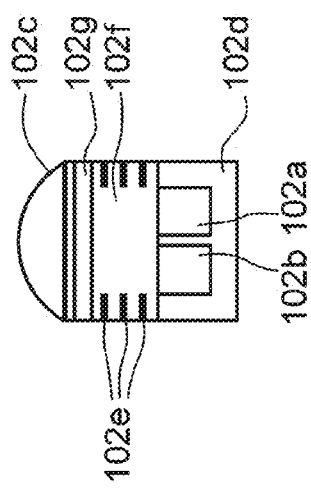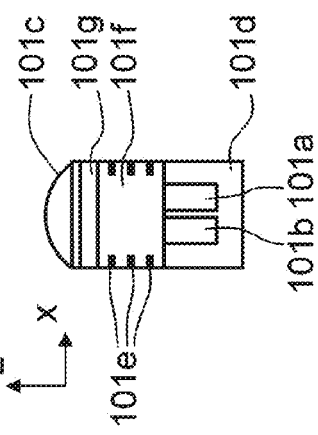

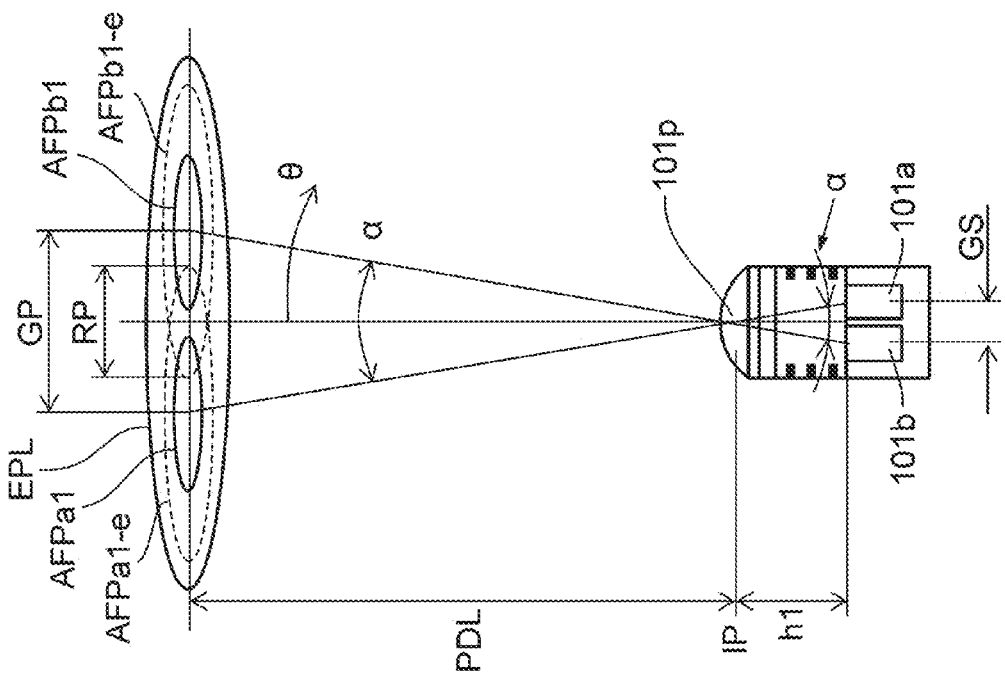
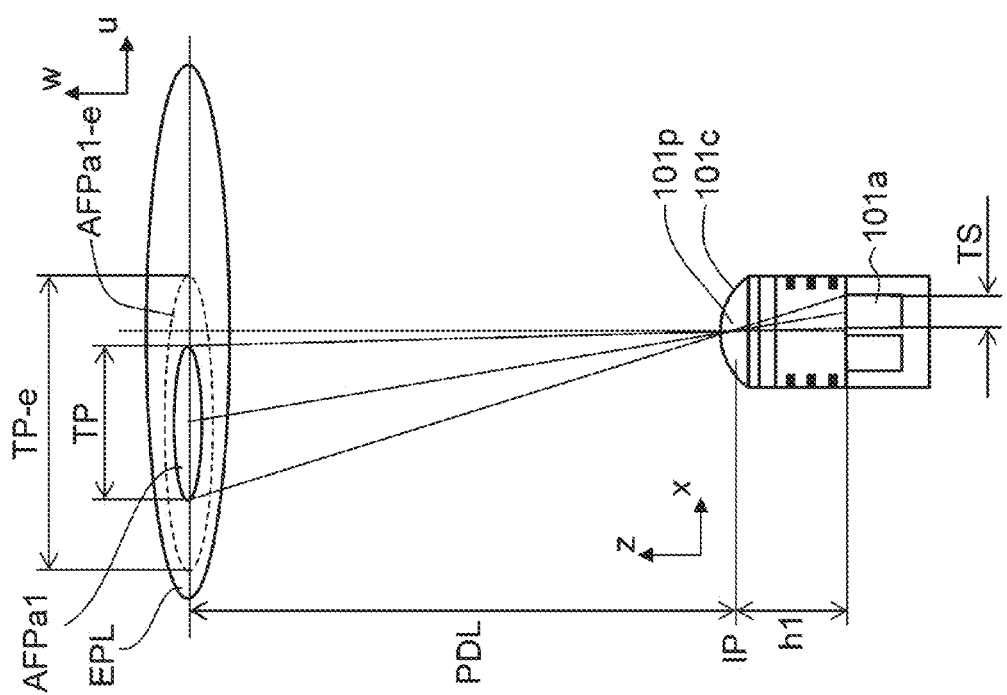

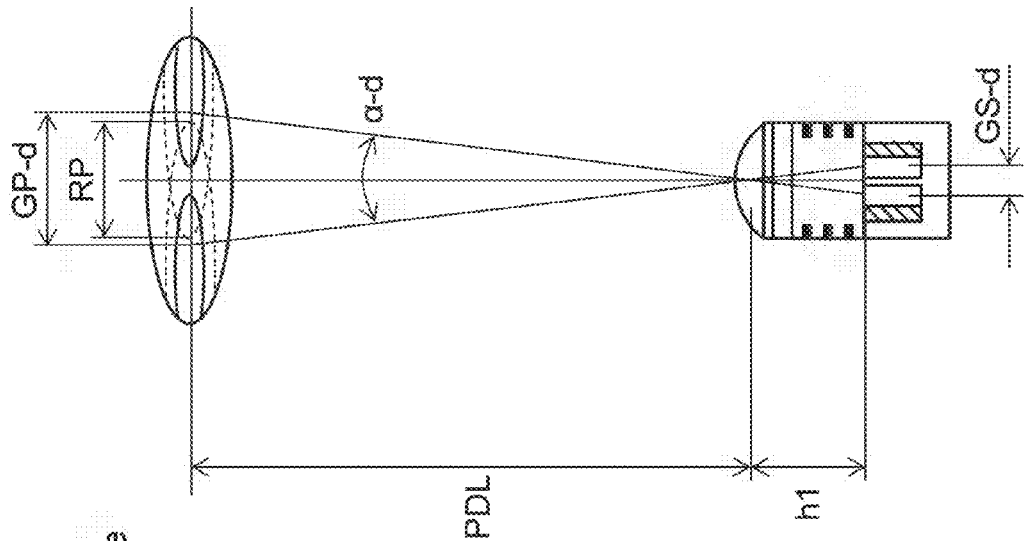
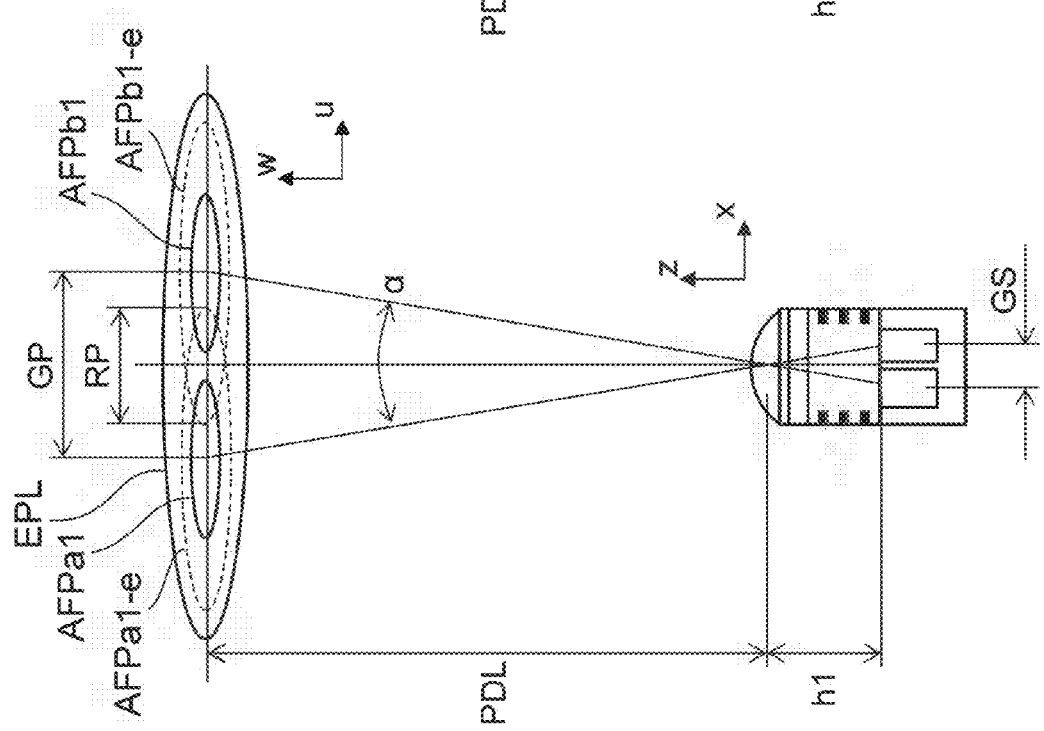

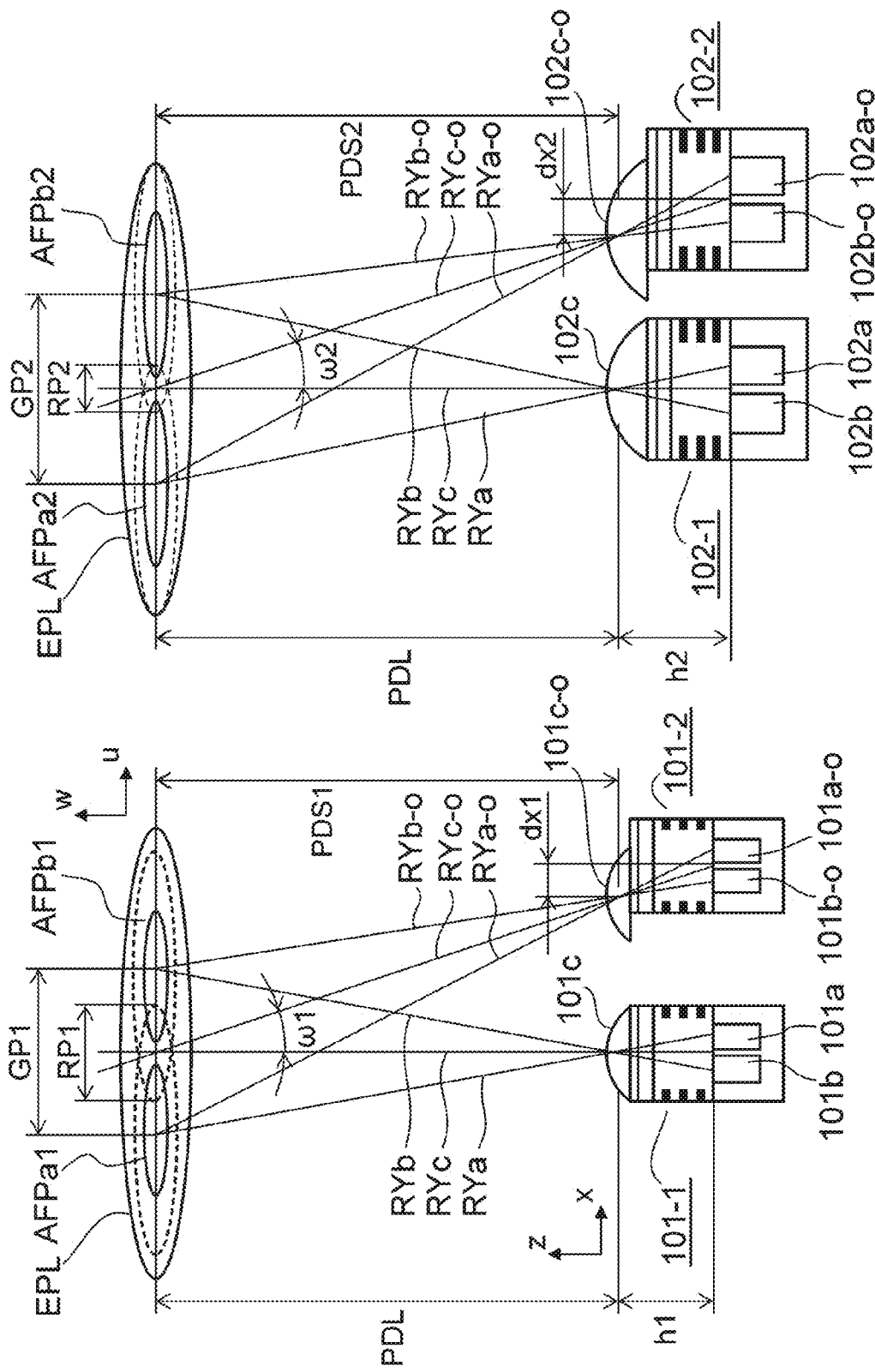

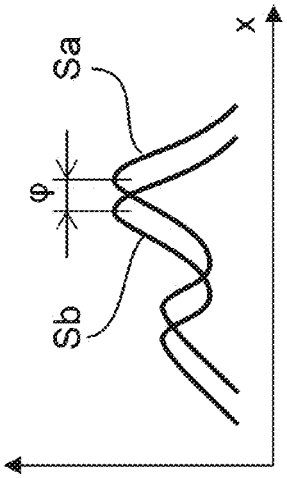
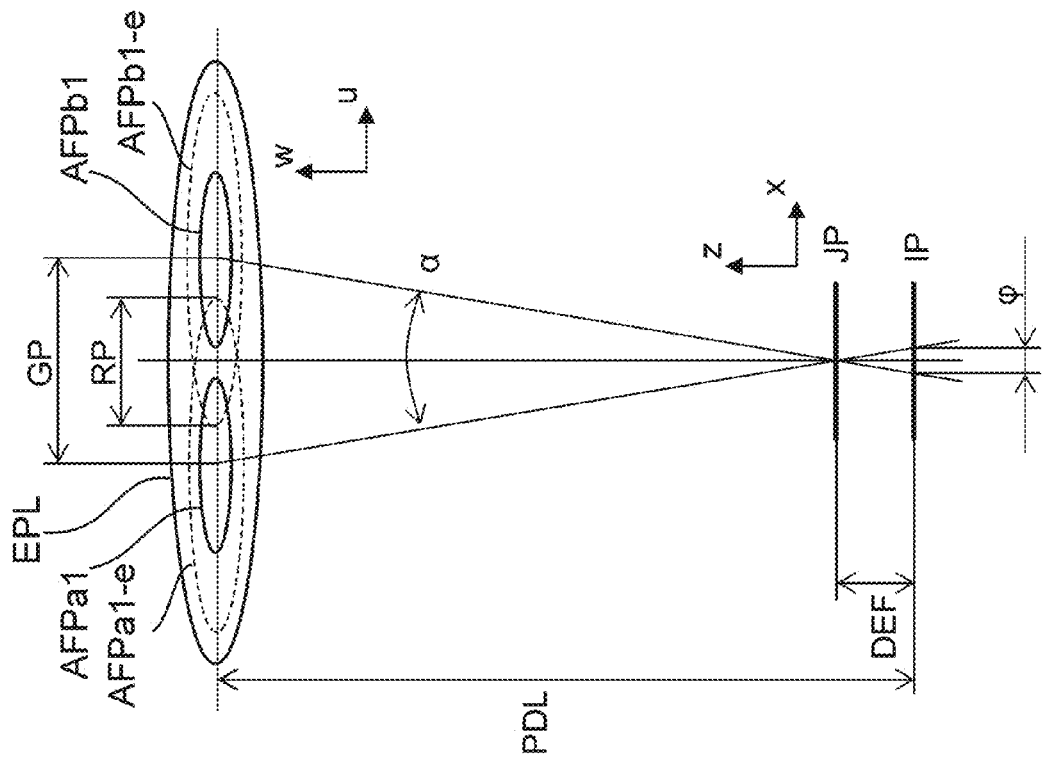

FIG. 11

| F-NUMBER | 1.4 | 2 | 2.8 | 4 | 5.6 | 8 | 11 | 16 |
|---|---|---|---|---|---|---|---|---|
| CONVERSION COEFFICIENT 1 | K11 | K12 | K13 | K14 | K15 | K16 | K17 | K18 |
| CONVERSION COEFFICIENT 2 | K21 | K22 | K23 | K24 | K25 | K26 | K27 | K28 |

*FIG. 17A*

| NO. | SWITCHING CONDITION |
|---|---|
| 1 | LARGE F-NUMBER |
| 2 | LOW BRIGHTNESS |
| 3 | CONTINUOUS IMAGE CAPTURING |

*FIG. 17B*

| | SWITCHING CONDITION |
|---|---|
| 1 | LARGE SPATIAL FREQUENCY |
| 2 | LOW CONTRAST (LARGE DEFOCUS) |

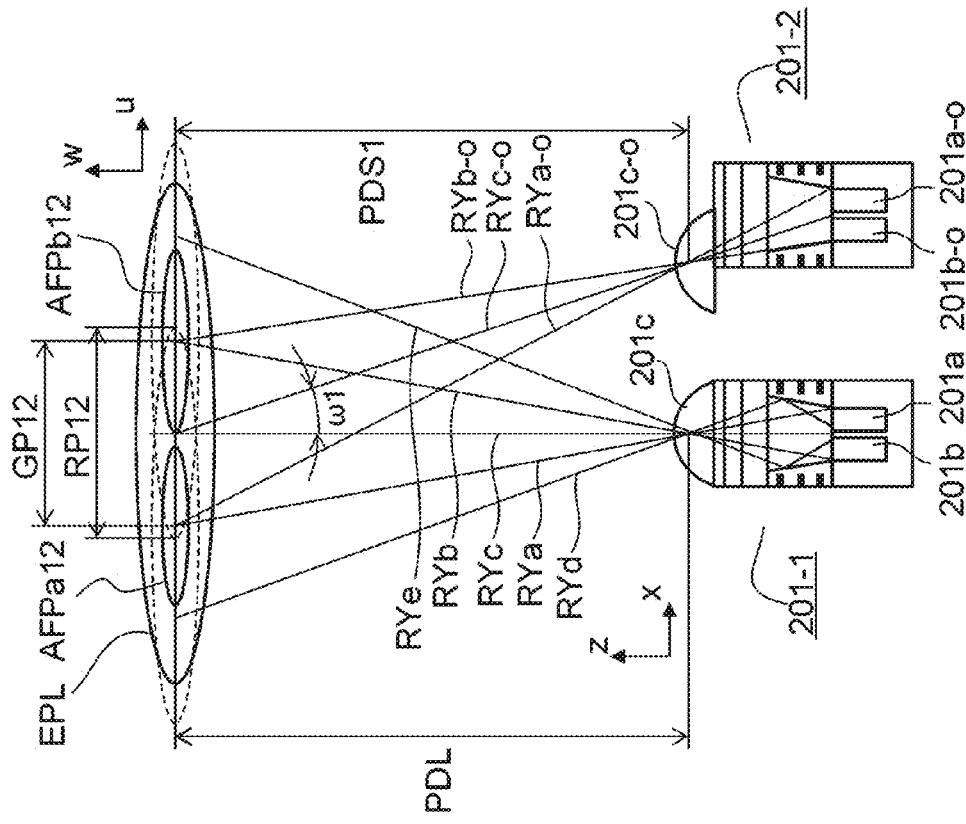
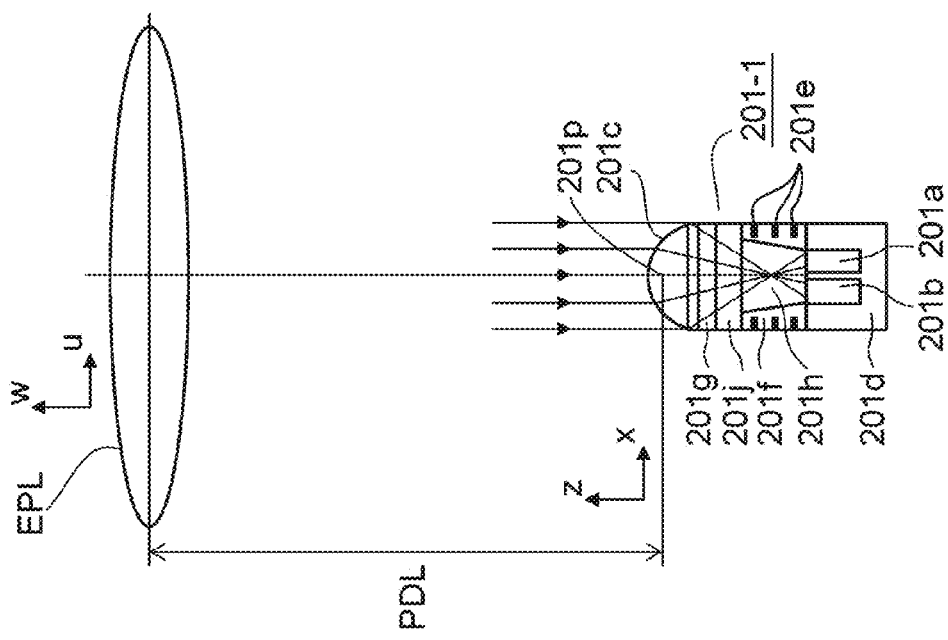
FIG. 18A
FIG. 18B

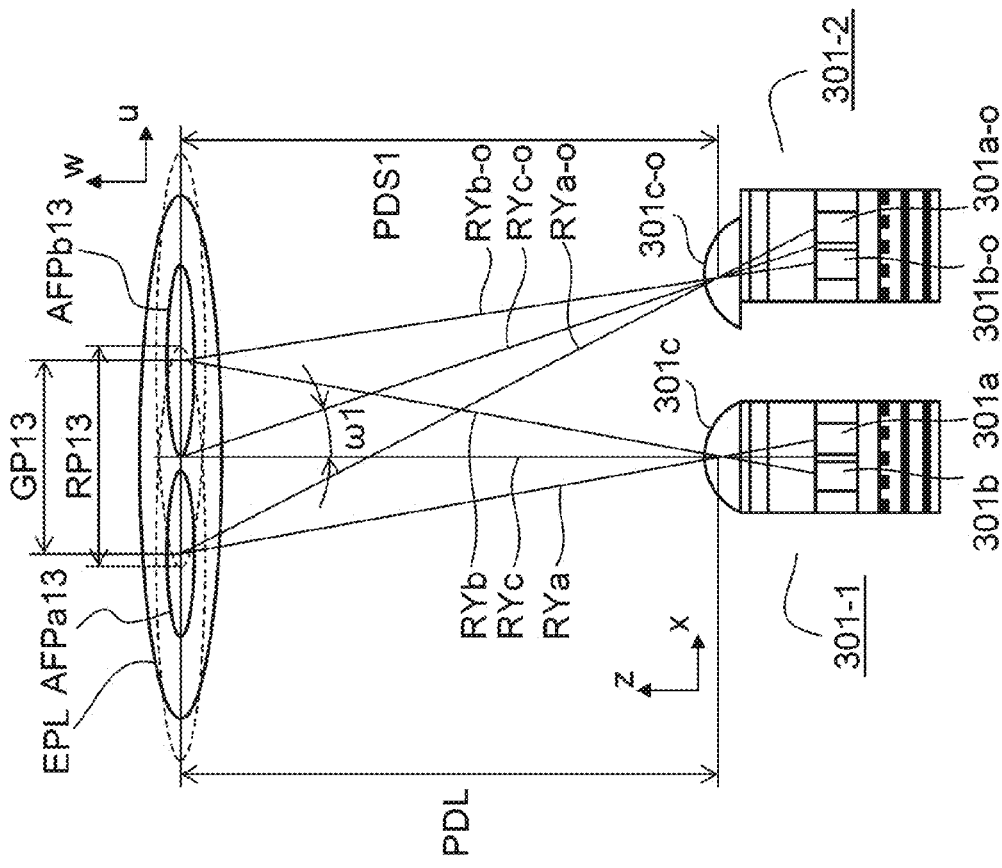
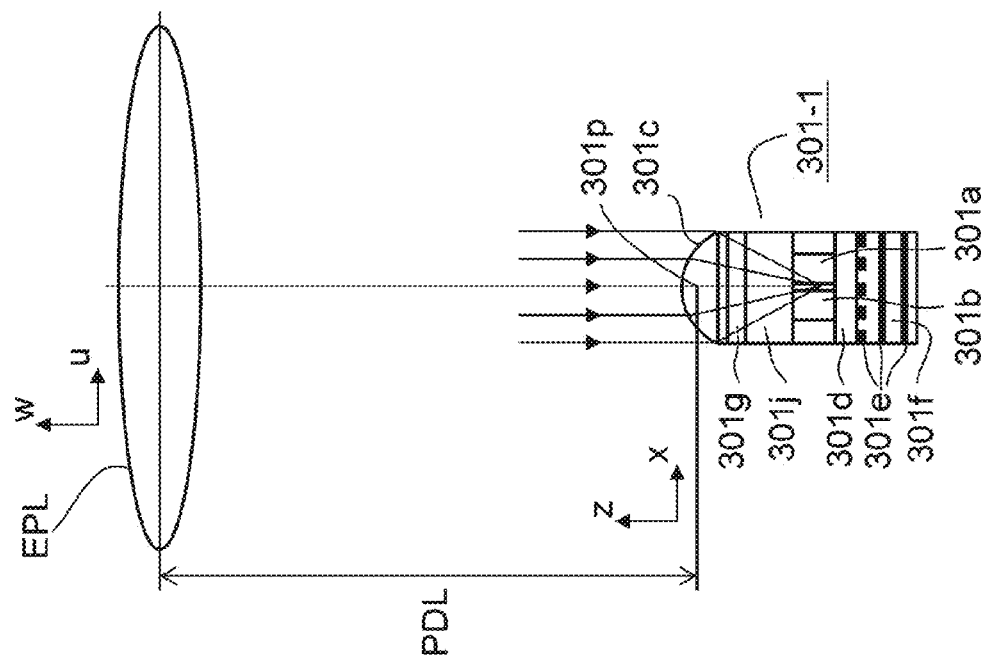

IMAGING APPARATUS WITH TWO IMAGE SENSORS

BACKGROUND OF THE INVENTION

Field of the Invention

One disclosed aspect of the embodiments relates to an imaging apparatus capable of performing focus detection.

Description of the Related Art

In recent years, there has been proposed an imaging apparatus including a plurality of image sensors that acquires an image for recording or display, and performs phase difference type focus detection on an imaging plane. An imaging apparatus of Japanese Patent Application Laid-Open No. 2015-34917 includes two image sensors with different pixel pitches for movie recording and still image recording. Japanese Patent Application Laid-Open No. 2015-34917 discloses that the two image sensors include a plurality of pixel portions for focus detection that have base lengths different from one another, and when one of the image sensors generates an image, focus detection is performed using the other one of the image sensors.

In Japanese Patent Application Laid-Open No. 2015-34917, a pixel portion for focus detection has a light-shielding portion, and a base length can be varied by changing the dimension of the light-shielding portion. The base length is one of factors affecting focus detection characteristics. Nevertheless, there has been the following problem. While the size of the light-shielding portion that shields light beams entering a photoelectric conversion unit can be changed relatively-freely in the pixel portion for focus detection, in terms of image quality, an unnatural portion may be generated in an image for recording.

SUMMARY OF THE INVENTION

An imaging apparatus is capable of acquiring an image signal for recording and a focus detection signal from each of two image sensors, and perform highly-accurate focus detection while acquiring an image signal for high-quality recording.

According to an aspect of the embodiments, an imaging apparatus includes a light beam splitter, or splitting unit, configured to split a light beam having passed through an exit pupil of an imaging lens, into a first light beam and a second light beam; a first image sensor including a plurality of micro lenses and configured to receive the first light beam; and a second image sensor including a plurality of micro lenses and configured to receive the second light beam, wherein the first image sensor includes a plurality of pixel portions, each pixel portion of the plurality of pixel portions includes one micro lens, and a first photoelectric conversion unit and a second photoelectric conversion unit that form a pair of photoelectric conversion units, and a first pupil region, through which a third light beam received by the first photoelectric conversion unit passes, and a second pupil region, through which a fourth light beam received by the second photoelectric conversion unit passes, are overlapped with each other, wherein the second image sensor includes a plurality of pixel portions, each pixel portion of the plurality of pixel portions includes one micro lens, and a third photoelectric conversion unit and a fourth photoelectric conversion unit that form a pair of photoelectric conversion units, and a third pupil region, through which a fifth light beam received by the third photoelectric conversion unit passes, and a fourth pupil region, through which a sixth light beam received by the fourth photoelectric conversion unit passes, are overlapped with each other, and wherein a distance between centroids of the third pupil region and the fourth pupil region is longer than a distance between centroids of the first pupil region and the second pupil region.

According to another aspect of the embodiments, an imaging apparatus includes a light beam splitter, or splitting unit, configured to split a light beam having passed through an imaging lens, into a plurality of light beams, a first image sensor configured to receive one of the light beams divided by the light beam splitter, and a second image sensor configured to receive another one of the light beams divided by the light beam splitter, wherein the first and second image sensors each includes a plurality of micro lenses, and includes a pair of photoelectric conversion units that corresponds to a corresponding one of the micro lenses, and wherein an apical angle formed by lines connecting a predetermined point of each micro lens and respective centroids of the pair of photoelectric conversion units for receiving light having passed through the corresponding micro lens varies between the first image sensor and the second image sensor.

According to yet another aspect of the embodiments, an imaging apparatus includes a light beam splitter, or splitting unit, configured to split a light beam having passed through an imaging lens, into a plurality of light beams, a first image sensor including a plurality of micro lenses and configured to receive one of the divided light beams, and a second image sensor including a plurality of micro lenses and configured to receive another one of the divided light beams, wherein each pixel portion included in the first and second image sensors includes a pair of photoelectric conversion units that corresponds to a corresponding one of the micro lenses, wherein, in each of the first image sensor and the second image sensor, a light beam received by one photoelectric conversion unit of the pair of photoelectric conversion units, and a light beam received by another photoelectric conversion unit partially overlap with each other, and wherein a distance between a point in a region of an exit pupil, through which a principal ray of the light beam received by the one photoelectric conversion unit passes, and a point in a region of an exit pupil, through which a principal ray of the light beam received by the other photoelectric conversion unit passes, varies between the first image sensor and the second image sensor.

Further features of the disclosure will become apparent from the following description of exemplary embodiments (with reference to the attached drawings).

BRIEF DESCRIPTION OF THE DRAWINGS

FIGS. 2A, 2B, 2C, and 2D are configuration diagrams of image sensors 101 and 102.

FIGS. 5A and 5B are diagrams illustrating a size of a pupil region and a base length.

FIGS. 6A and 6B are diagrams illustrating a relationship between an F-number of an imaging lens 500 and a base length of pupil regions.

FIGS. 7A and 7B are diagrams illustrating a relationship between pupil regions of the image sensors 101 and 102.

FIGS. 9A and 9B are diagrams illustrating a relationship between a defocus amount and an image shift.

FIG. 11 is a diagram illustrating an F-number and a defocus amount conversion coefficient.

FIGS. 17A and 17B are diagrams illustrating conditions for switching an image sensor to be used in focus detection.

FIGS. 18A and 18B are diagrams illustrating a configuration of an image sensor 201 and a pupil region.

FIGS. 20A and 20B are diagrams illustrating a configuration of an image sensor 301 and a pupil region.

DESCRIPTION OF THE EMBODIMENTS

Preferred embodiments of the disclosure will be described below in detail based on the attached drawings.

First Exemplary Embodiment

Figure 1:
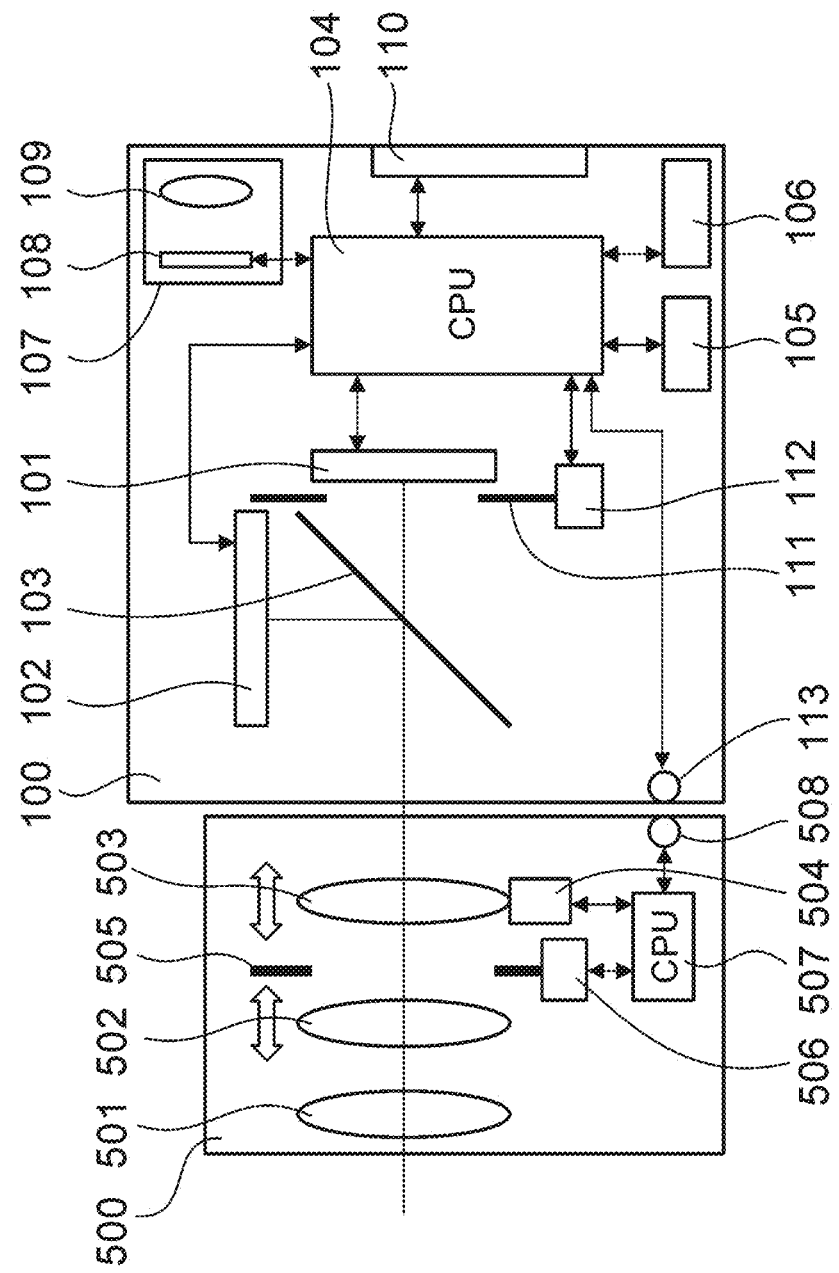
FIG. 1 is a configuration diagram of an imaging apparatus.

FIG. 1 is a configuration diagram of an interchangeable-lens digital camera main body 100 and an imaging lens 500 being an interchangeable lens, which serve as an example of an imaging apparatus to which the disclosure is applied.

A light beam transmitted through lens groups 501 to 503 of the imaging lens 500 enters a beam splitter 103 serving as a light beam splitter, or splitting unit, that is provided in the camera main body 100. The beam splitter 103 is fixed in the camera main body 100, and is a half mirror in the present exemplary embodiment. One light beam of light beams split by the beam splitter 103 is transmitted through the beam splitter 103 to be guided to an image sensor 101 serving as a first image sensor that is disposed on a first imaging plane. The other light beam is reflected on the beam splitter 103 to be guided to an image sensor 102 serving as a second image sensor that is disposed on a second imaging plane. In addition, the beam splitter 103 may not be necessarily a half mirror as long as the beam splitter 103 can split incident light beams similarly to half mirrors.

The first and second imaging planes are on optically equivalent positions when viewed from the imaging lens 500. In other words, the image sensor 101 disposed on the first imaging plane and the image sensor 102 disposed on the second imaging plane can be said to be on the respective image forming planes optically-conjugate with respect to a subject (not illustrated) via the imaging lens 500.

Subject images with brightness varying according to the transmittance and reflectance of the beam splitter 103 are formed on the first and second imaging planes. The half mirror (the beam splitter 103) disposed in the imaging light beam desirably has an ideal plane. In actuality, the half mirror has waviness or curvature to some extent. Thus, the image quality of images formed by light beams transmitted through and reflected on the beam splitter 103 may be degraded. In addition, the degree of such image quality degradation is relatively larger in the image formed by the reflected light beam as compared with the image formed by the transmitted light beam. In view of this tendency, in the present exemplary embodiment, the image sensor 101 on the transmitted side is assumed to be used for recording a still image in which an individual pixel size is small and the total number of pixels is large, and the image sensor 102 on the reflected side is assumed to be used for recording a movie in which an individual pixel size is large and the total number of pixels is small. The disclosure, however, is not limited to this configuration. The positions of the image sensors 101 and 102 may be switched according to the characteristics of the beam splitter 103 or other conditions.

The image sensors 101 and 102, which are complementary metal-oxide semiconductor (CMOS) area sensors, are formed by pixel portions arranged in a matrix that convert subject images into electrical signals. The pixel information converted into an electrical signal is subjected to various types of processing. For example, a camera central processing unit (CPU) 104 performs various types of correction processing for obtaining an image signal and a focus detection signal. In addition, processing for converting the obtained image signal into a live view image or a recording image is performed. In the present exemplary embodiment, these types of processing are performed by the camera CPU 104. Alternatively, dedicated circuits may be provided, and these types of processing may be performed by the circuits. An operating member 105 includes various members for setting an image capturing mode, an image capturing condition, and the like of the camera according to a user operation. A storage medium 106 is a flash memory, and is a medium for recording a captured still image or movie. An in-viewfinder display 107 includes a compact and high-definition display 108 serving as a display unit, such as an organic electroluminescence (EL) display and a liquid crystal display, and an eyepiece lens 109. An external display 110 is an organic EL display or a liquid crystal display with a screen size suitable for naked vision. Various types of information such as the setting status of the camera main body 100, a live view image, and a captured image are displayed on the in-viewfinder display 107 and the external display 110.

A focal plane shutter 111 is disposed on the front surface of the image sensor 101. A shutter driving unit 112 is, for example, a motor, and controls an exposure time in still image recording by drive-controlling a blade of a shutter. A camera side communication terminal 113 is provided on a camera mount portion (not illustrated) for mounting an interchangeable lens. Together with a lens side communication terminal 508 provided on a lens mount portion (not illustrated), the camera side communication terminal 113 transmits and receives information exchanged between the camera CPU 104 and a lens CPU 507 to be described later.

The imaging lens 500 is detachably attached to the camera main body 100. In the present exemplary embodiment, the imaging lens 500 is a zoom lens with a variable focal length. After having been transmitted through the first lens group 501, the second lens group 502, and the third lens group 503, a light beam from a subject forms a subject image on an imaging plane in the camera main body 100. The second lens group 502 functions as a variator that performs zooming while moving back and forth in an optical axis direction. The third lens group 503 functions as a focus lens that performs focus adjustment while moving back and forth in the optical axis direction. The third lens group 503 is driven by a focus driving unit 504 that uses a stepping motor and the like. An iris diaphragm 505 includes a plurality of diaphragm blades for adjusting the amount of light entering the imaging lens 500. A diaphragm driving unit 506 drives the diaphragm blades to stop down the diaphragm until a predetermined F-number is achieved. The lens CPU 507 communicates with the camera CPU 104 via the lens side communication terminal 508 and the camera side communication terminal 113 to transmit and receive various types of information. In addition, the lens CPU 507 drive-controls the focus driving unit 504 and the diaphragm driving unit 506 based on a command from the camera CPU 104.

FIGS. 2A to 2D are diagrams illustrating the configurations of the image sensors 101 and 102. The image sensor 101 is an image sensor for mainly recording still images. In the present exemplary embodiment, each of the plurality of pixel portions included in the image sensor 101 is a square-shaped pixel portion having the size of 4 μm in both of a horizontal direction (x) and a vertical direction (y) on the imaging plane. The structures of the pixel portions included in the image sensor 101 are all the same except for the eccentricity of a micro lens, which will be described later. The image sensor 101 is an image sensor having these pixel portions arrayed with 6,000 pixels in the horizontal direction and 4,000 pixels in the vertical direction, i.e., having the effective number of pixels of 24,000,000 pixels. The size of an imaging region can be obtained by multiplying the size of the pixel portions, i.e., a pixel pitch by the number of pixels. In this case, the imaging region has the size of 24 mm in the horizontal direction and 16 mm in the vertical direction. In each of the pixel portions, RGB color filters are arrayed in a mosaic manner.

The image sensor 102 is an image sensor for mainly recording movies. In the present exemplary embodiment, each of the plurality of pixel portions included in the image sensor 102 has the size of 6 μm in both of the horizontal direction (x) and the vertical direction (y). The structures of the pixel portions included in the image sensor 102 are all the same except for the eccentricity of a micro lens, which will be described later. The image sensor 102 is an image sensor for a so-called 4K movie that has these pixel portions arrayed with 3,840 pixels in the horizontal direction and 2,160 pixels in the vertical direction, i.e., having the effective number of pixels of 8,300,000 pixels. The size of the imaging region can be obtained by the calculation similar to that for the first image sensor. In this case, the imaging region has the size of 23.04 mm in the horizontal direction and 12.96 mm in the vertical direction. Similarly to the image sensor 101, in each of the pixel portions, RGB color filters are arrayed in a mosaic manner.

In this manner, in the present exemplary embodiment, each of the pixel portions included in the image sensor 101 is smaller as compared with the pixel portions included in the image sensor 102. In addition, the imaging region of the image sensor 101 is larger as compared with the imaging region of the image sensor 102. Nevertheless, the number of pixels and the size of pixel portions can be changed without departing from the scope of the disclosure.

FIGS. 2A and 2B are configuration diagrams of the image sensor 101. FIG. 2A is a plan view of a part of the pixel portions near the center of the imaging plane (near the image height 0) viewed from the imaging lens 500 side. FIG. 2B is a cross-sectional view of one pixel portion of these partial pixel portions. A photoelectric conversion unit 101a serving as a first photoelectric conversion unit and a photoelectric conversion unit 101b serving as a second photoelectric conversion unit are provided within a silicon substrate 101d forming a base body of a CMOS image sensor. In addition, a switching transistor (not illustrated) that converts photoelectrons generated in the photoelectric conversion units into voltage and reads out to the outside, and the like are formed within the silicon substrate 101d. Output signals from the photoelectric conversion units are read out by wiring layers 101e.

Each of the wiring layers 101e is insulated by a transparent interlayer film 101f. A color filter 101g for color separation is provided beneath an on-chip micro lens 101c. In phase difference type focus detection, a pair of two phase difference images is generated by individually processing output signals from the photoelectric conversion units 101a and 101b. The camera CPU 104 (focus detection unit) calculates a defocus amount of a subject image on the imaging plane from a relative image shift amount of the two images. In addition, the camera CPU 104 (addition control unit) obtains an image signal for recording or an image signal for live view (display) of a still image or a movie by adding signals from the pair of photoelectric conversion units 101a and 101b. In addition, the addition processing may be performed by providing a dedicated circuit.

FIGS. 2C and 2D are a main part plan view and a cross-sectional view of the image sensor 102, and respectively correspond to FIGS. 2A and 2B illustrating the image sensor 101. The sizes, i.e., the dimensions in xyz directions of various functional units included in the pixel portion are different between the image sensors 101 and 102, but the functions are substantially the same. Thus, the detailed description thereof will be omitted.

Figure 3:
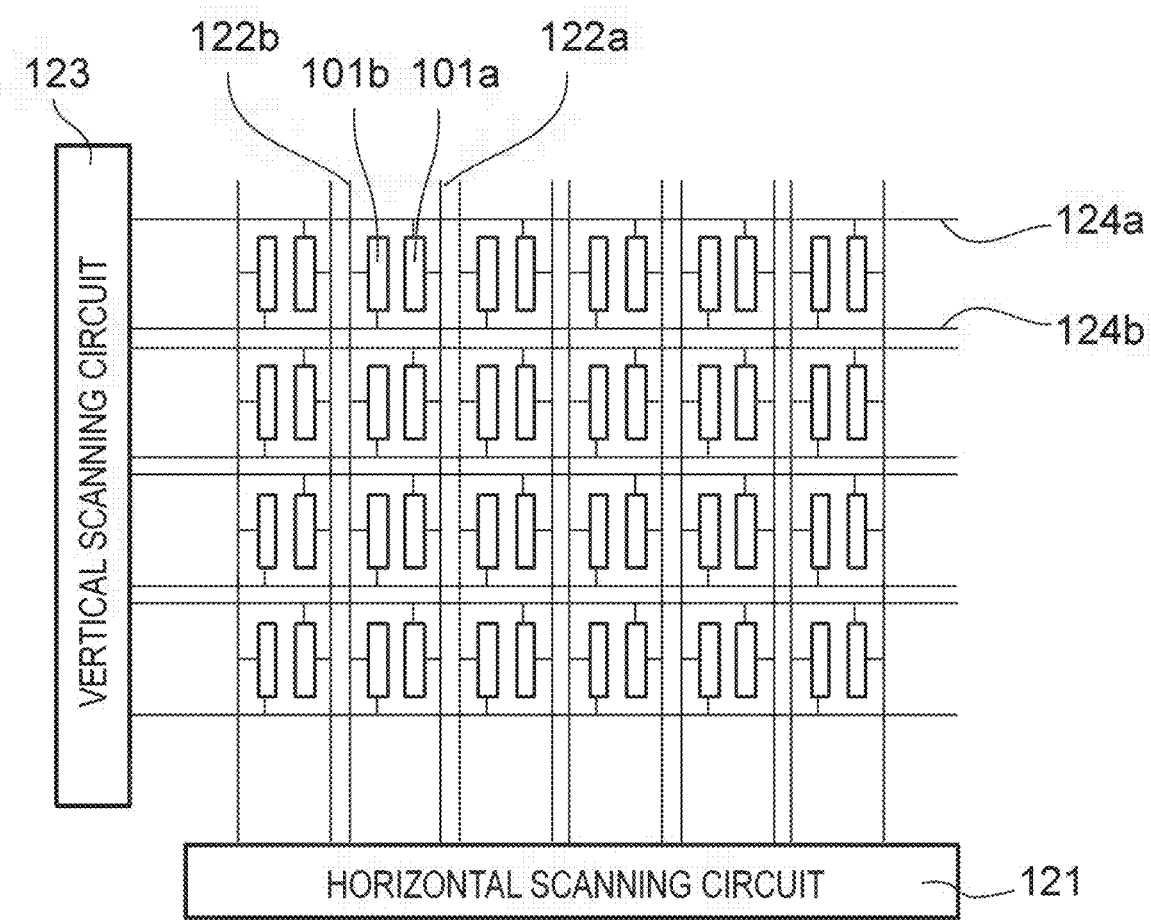
FIG. 3 is a configuration diagram of a readout circuit of the image sensor 101.

FIG. 3 is a diagram illustrating the configuration of a readout circuit of the image sensor 101. The photoelectric conversion units 101a and 101b are a pair of photoelectric conversion units disposed in one pixel portion. The readout circuit of the image sensor includes a horizontal scanning circuit 121 and a vertical scanning circuit 123. In addition, horizontal scanning lines 122a and 122b and vertical scanning lines 124a and 124b are laid at the boundary portion of the pixel portions. In addition, signals from the photoelectric conversion units are read out to the outside via these scanning lines. The image sensor 102 also includes a readout circuit similar to the above-described readout circuit. Thus, the description thereof will be omitted.

In addition, the image sensors 101 and 102 according to the present exemplary embodiment have the following two types of readout modes. The first readout mode is referred to as a full-pixel readout mode, and is a mode for capturing a still image or a movie for recording. In this case, signals from all the pixel portions are read out. The second readout mode is referred to as a sub-sampling readout mode, and is a mode for displaying a live view image. The live view image refers to an image for displaying an image acquired by an image sensor on the in-viewfinder display 107 or the external display 110 in a real time. The number of pixels required for the live view is smaller than the total number of pixels. The image sensor therefore reads out signals only from pixel portions thinned out at a predetermined ratio in both the x and y directions. This reduces the processing load on a signal processing circuit, and also contributes to the reduction in power consumption. In addition, in both of the first and second readout modes, signals from a pair of two photoelectric conversion units included in each pixel portion are separately read out. Thus, in both modes, signals for focus detection can be generated.

In addition, in the present exemplary embodiment, the image sensor 101 is used mainly for still image recording.

This, however, is not to be construed as prohibiting movie recording. For example, while the image sensor 102 is recording a movie, the image sensor 101 can record a sub-sampling readout image described above, as a low-resolution movie. In a similar manner, the image sensor 102 is used mainly for movie recording, but the image sensor 102 can also be used for still image recording. For example, desired one frame can be recorded as a still image during movie recording.

Figure 4A:
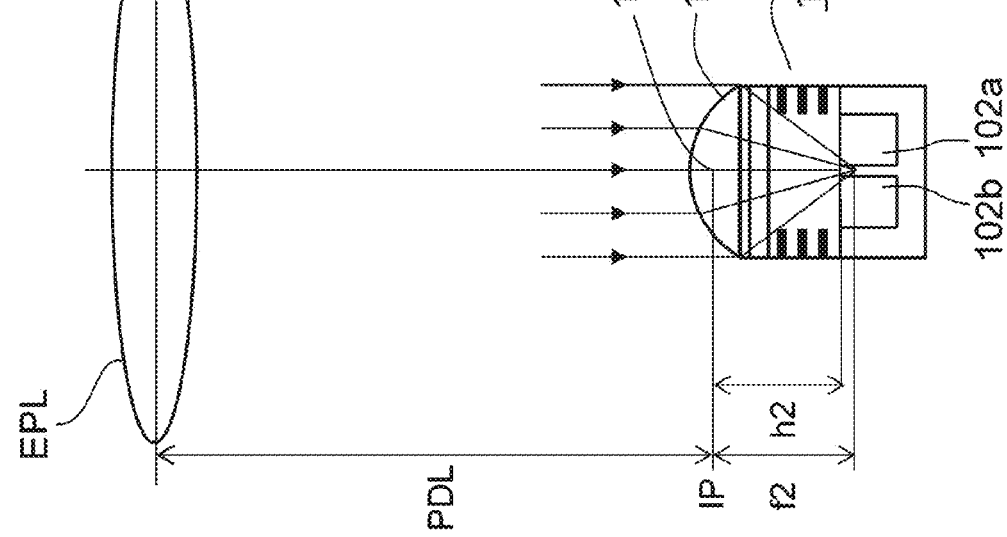
FIGS. 4A and 4B are diagrams illustrating micro lens focus positions of the image sensors 101 and 102.
Figure 4B:
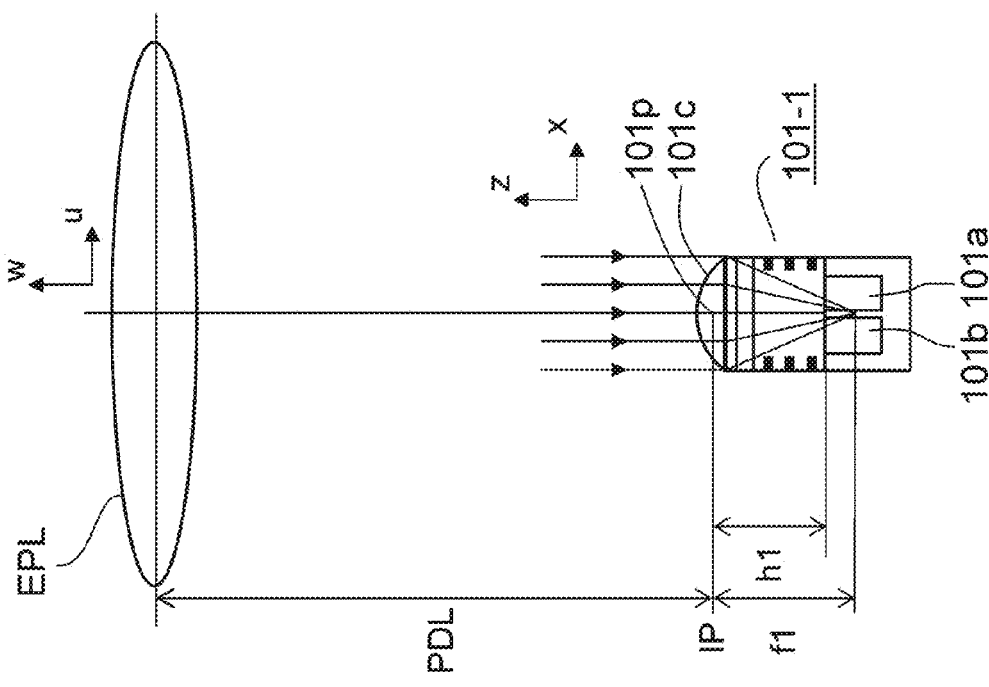

FIGS. 4A and 4B are diagrams conceptually illustrating a focus position of a micro lens included in each pixel portion of the image sensors 101 and 102 according to the present exemplary embodiment. FIG. 4A is a diagram illustrating a pixel portion included in the image sensor 101, and FIG. 4B is a diagram illustrating a pixel portion included in the image sensor 102. First, FIG. 4A will be described.

A pixel portion 101-1 is positioned at the center of an imaging region, that is, positioned on an optical axis of the imaging lens 500. A principal point 101p corresponds to a planned image forming position serving as a reference position in considering a light ray refraction function of the micro lens 101c included in the pixel portion 101-1. A plane IP passing through the principal point 101p and being orthogonal to the optical axis corresponds to a planned image forming plane of the image sensor 101, i.e., a so-called imaging plane. In other words, a state in which an in-focus position of a subject image formed by the imaging lens 500 falls on the planned image forming plane IP where the respective principal points 101p of micro lenses are arranged refers to an in-focus state, and a subject image acquired by the image sensor 101 in this state becomes the sharpest subject image. In addition, since the thickness of the micro lens 101c is about 1 μm, the principal point 101p can be regarded as the peak of the micro lens 101c. An exit pupil EPL of the imaging lens 500 is an image of a diaphragm obtained when the diaphragm is viewed from the imaging plane, and the image sensors 101 and 102 receive light beams having passed through the exit pupil EPL. While the plane shape of the exit pupil EPL is circular and the cross section thereof is plane, in FIGS. 4A and 4B, the exit pupil EPL is illustrated in an elliptical shape for clearly describing the magnitude relationship with a pupil region, which will be described below.

A distance between the principal point 101p of the micro lens 101c and the exit pupil EPL of the imaging lens 500 corresponds to an exit pupil distance PDL. A height h1 between the principal point 101p and the upper surfaces of the photoelectric conversion units 101a and 101b corresponds to an optical height of the pixel portion. Strictly speaking, an optical height is defined as a value obtained by the height h1 being a mechanical dimension by a refractive index of an optical path portion of the pixel portion. Nevertheless, in this example, the height h1 illustrated in FIG. 4A is regarded as the height of the pixel portion. In FIG. 4A, the exit pupil distance PDL is illustrated to have the length of about several folds of the height h1. In actuality, however, while the height h1 is in a micrometer order, the exit pupil distance PDL is in a several tens of millimeters order. Thus, the sizes of them have a difference corresponding to about four digits. In other words, the exit pupil EPL of the imaging lens 500 may be regarded as being at an infinite distance when viewed from the pixel portion 101-1. Thus, if the focus position of the micro lens 101c is on the upper surfaces of the photoelectric conversion unit 101a or 101b, the exit pupil EPL and the upper surfaces of the photoelectric conversion unit 101a or 101b become optically conjugate, and a pair of reverse projection images respectively corresponding to the pair of photoelectric conversion units 101a and 101b are formed at the same position as the exit pupil EPL with respect to the optical axis direction. By detecting a relative shift amount between a pair of image signals corresponding to a pair of light beams having passed through a pair of pupil regions, which are partial regions of regions corresponding to the pair of reverse projection images that are overlapped with the exit pupil EPL, the camera CPU 104 detects a focal point shift amount, i.e., a so-called defocus amount of the image. In other words, the pair of pupil regions functions as a pair of so-called focus detection pupils for phase difference detection on the imaging plane. The pair of pupil regions will be described in detail with reference to FIGS. 5A and 5B.

The influence of a focus position of the micro lens 101c that is exerted on an image for image capturing and an image for focus detection will now be described. Each pixel portion of the image sensors 101 and 102 has both an image capturing function and a focus detection function. In other words, by separately handling the outputs from the pair of photoelectric conversion units 101a and 101b, focus detection is performed. In this case, as the outline of the pair of pupil regions, which corresponds to reverse projection images of the pair of photoelectric conversion units, becomes sharper and the distance between centroids thereof becomes longer, the out-of-focus amount of the image for focus detection becomes smaller, and an image shift amount becomes larger, so that highly-accurate focus detection can be performed. On the other hand, a signal obtained by adding the outputs from the pair of photoelectric conversion units 101a and 101b by the camera CPU 104 serving as the addition control unit is an image signal for recording or display. In addition, a dedicated circuit for the addition processing may be provided and the addition processing may be performed by the dedicated circuit.

In this case, if the above-described pair of pupil regions are clearly separated in a u direction of a surface coordinate of the exit pupil EPL, a region that does not function as a pupil for letting light rays through is generated between the pair of pupil regions. In this state, a light beam that has entered the pixel portion after having passed through the center (optical axis) of the exit pupil EPL is not photoelectrically-converted for the following reason.

For example, there is a boundary portion between the pair of photoelectric conversion units 101a and 101b, and the boundary portion may become a blind zone depending on a process. If the boundary portion is a blind zone and the dimension thereof is unignorably large, and the focus position of the micro lens 101c falls on the photoelectric conversion unit upper surface, a pair of pupil regions are clearly separated in the u direction of the surface coordinate of the exit pupil EPL. In this manner, since the pair of pupil regions are clearly separated in the u direction, a light beam that has entered the pixel portion after having passed through the center (optical axis) of the exit pupil EPL is not photoelectrically-converted for the above-described reason.

If a pair of pupil regions are clearly separated in the u direction of the surface coordinate of the exit pupil EPL in this manner, the influence on an in-focus image is ignorable, but a defocus image being out of focus may partially contain shade, and image quality degradation such as so-called double-line blur may be caused in out of focus area of the image. To avoid this phenomenon, in the present exemplary embodiment, the focus position of the micro lens 101c included in each pixel portion of the image sensor 101 is set to a position deviated downward by a predetermined dimension from the upper surfaces of the photoelectric conversion units 101a and 101b, as illustrated in FIG. 4A. In other words, the focus position is located in a direction deeper than the surfaces of the photoelectric conversion units 101a and 101b with respect to the micro lens. More specifically, by canceling the above-described optically-conjugate state of the exit pupil EPL and the upper surfaces of the photoelectric conversion units 101a and 101b, the pupil regions are defocused. By defocusing the pupil regions to provide the partial region of the above-described pair of pupil regions where the pupil regions are overlapped with each other, even a light beam that has entered the pixel portion after having passed through the center (optical axis) of the exit pupil EPL is photoelectrically-converted. Even in a defocus image being out of focus, image quality degradation can be suppressed.

Next, the pixel characteristics of the image sensor 102 will be described using FIG. 4B. Similarly to FIG. 4A, a pixel portion 102-1 is positioned at the center of an imaging region, that is, positioned on the optical axis of the imaging lens 500. The plane IP passing through a principal point 102p of a micro lens 102c and being orthogonal to the optical axis corresponds to a planned image forming plane of the image sensor 102, i.e., a so-called imaging plane. In the pixel portion, the focus position of the micro lens 102c is set at a position slightly deviated downward from the upper surfaces of photoelectric conversion units 102a and 102b, but the amount of deviation is smaller than the amount of deviation in the image sensor 101. In other words, the ratio of the distance between the focus position of the micro lens 101c and the principal point 101p with respect to a pixel height in the image sensor 101 is larger than the ratio of the distance between the focus position of the micro lens 102c and the principal point 102p with respect to a pixel height in the image sensor 102. When the height of the pixel portion of the image sensor 101 is denoted by h1, a focal length of the micro lens 101c is denoted by f1, the height of the pixel portion of the image sensor 102 is denoted by h2, and a focal length of the micro lens 102c is denoted by f2, the relationship between these numerical values is as follows:

$$f1/h1 > f2/h2 \quad \text{(Formula 1)}.$$

In other words, the pupil regions of the image sensor 101 have a relatively-larger out-of-focus amount and lower sharpness, whereas the pupil regions of the image sensor 102 have a relatively-smaller out-of-focus amount and higher sharpness. Thus, the image sensor 102 is superior in terms of focus detection performance, and the image sensor 101 is superior in terms of the quality of a defocus image. Such characteristics are employed for the following reasons.

The image sensor 101 is used mainly for still image recording. When still images are viewed, the still images are often enlarged and displayed on a liquid crystal display having a large screen. Thus, if the image quality is low, the low image quality is easily-noticeable. In addition, when images printed by an inkjet printer or the like are viewed, even a slight image quality difference is influential because recent printers have very-high output resolution. On the other hand, when movies are viewed, a part of an image is rarely enlarged. In addition, in movies, an image varies according to a pan operation and a zooming operation of a camera. Thus, the tolerance for image quality in movies is higher as compared with that in still images. For this reason, in the present exemplary embodiment, the image sensor 101 for still images has pixel characteristics centered on image quality as compared with the image sensor 102 for movies.

FIGS. 5A and 5B are diagrams illustrating a projection relationship between the exit pupil EPL of the imaging lens 500 and the photoelectric conversion units 101a and 101b, from a viewpoint different from FIGS. 4A and 4B. FIG. 5A is a diagram illustrating the characteristics of the pupil region corresponding to one of the pair of photoelectric conversion units 101a and 101b in the pixel portion included in the image sensor 101, i.e., the photoelectric conversion unit 101a. FIG. 5B is a diagram illustrating a base length of a pair of pupil regions corresponding to the pair of photoelectric conversion units 101a and 101b. The description of the parts identical to those described with reference to FIGS. 4A and 4B will be omitted.

The exit pupil EPL of the imaging lens 500 and the upper surface of the photoelectric conversion unit 101a are in an optically substantially conjugate state via the micro lens 101c. Thus, a reverse projection image corresponding to the photoelectric conversion unit 101a is formed at the same position as the exit pupil EPL with respect to the optical axis direction. Thus, a light beam emitted from a subject forms an image on an imaging plane after having passed through the inner side of a pupil region AFPa1, which is a partial region of the region corresponding to the reverse projection image that is overlapped with the exit pupil EPL. The light beam then enters the photoelectric conversion unit 101a to be photoelectrically-converted.

When a width in the X direction of the photoelectric conversion unit 101a is denoted by TS, and a width of the pupil region AFPa1 is denoted by TP, the following formula is obtained based on the similarity relationship between two triangles having peaks corresponding to the principal point 101p of the micro lens:

$$TP/PDL = TS/h1 \quad \text{(Formula 2)}.$$

The width TP of the pupil region AFPa1 can be calculated by the following formula:

$$TP = TS \times (PDL/h1) \quad \text{(Formula 3)}.$$

It should be noted that the relationships represented by Formulae 2 and 3 are strictly satisfied only when the photoelectric conversion unit 101a and its reverse projection image are in an optically ideal conjugate relationship. On the other hand, as described above with reference to FIG. 4A, since the focus position of the micro lens 101c is in a back focus state with respect to the upper surfaces of the photoelectric conversion units, the photoelectric conversion unit 101a and the pupil region AFPa1 are not in an ideal conjugate relationship. Thus, the pupil region AFPa1 is also defocused. In addition, the size of each pixel portion of the image sensor is very small, i.e., in a micrometer scale, and wave characteristics of light beams entering the pixel portion become prominent. Accordingly, even if a geometric optically ideal image forming relationship is satisfied, so-called diffraction blur is generated due to the diffraction of light waves.

Furthermore, a region of the photoelectric conversion unit where photoelectric conversion is actually performed does not fit within only one plane on an xy-plane, and spreads to a region with several micrometers along a z-axis. Thus, the reverse projection image of the photoelectric conversion unit that is reversely projected at the same position as the exit pupil EPL with respect to the optical axis direction is not an exact plane, either, and has a three dimensional shape extending also in the z-axis direction. Thus, if such a shape is projected on one plane, the outline thereof becomes unsharp, and predetermined blur is generated. In other words, the corresponding pupil region AFPa1 also becomes a region extending in the z-axis direction.

For the above-described several reasons, blur specific to the image sensor is generated in the pupil region AFPa1, and spreads to the outside of the geometric optical pupil region AFPa1. The spread region is illustrated as a pupil region AFPa1-e indicated by a broken line in FIG. 5A, and the width thereof is denoted by TP-e.

The pupil region corresponding to the single photoelectric conversion unit 101a has been described with reference to FIG. 5A. The base length of a pair of pupil regions formed by the pair of photoelectric conversion units 101a and 101b will be described with reference to FIG. 5B. In FIG. 5B, the pixel portion includes the pair of photoelectric conversion units 101a and 101b symmetric with respect to the optical axis. In FIG. 5A, the pupil region AFPa1 is a partial region included in the exit pupil EPL that corresponds to the photoelectric conversion unit 101a, as described above. In a similar manner, a pupil region AFPb1 is a partial region included in the exit pupil EPL that corresponds to the photoelectric conversion unit 101b. As compared with the pupil regions AFPa1 and AFPb1 obtained if a geometric optically ideal conjugate relationship is assumed to be satisfied, actual pupil regions AFPa1-e and AFPb1-e are broader for the above-described reason.

Light beams emitted from a subject form an image on an imaging plane after having passed through the inner sides of the pair of pupil regions AFPa1 and AFPb1. The light beams then enter the pair of photoelectric conversion units 101a and 101b to be photoelectrically-converted. In this manner, the light beams received by the pair of photoelectric conversion units 101a and 101b are light beams having passed through different regions in the exit pupil EPL of the imaging lens 500. Thus, the pair of light beams has a parallax. In addition, the amount of parallax is proportional to a distance between the centroids of the pair of pupil regions AFPa1 and AFPb1 (may be the pupil regions AFPa1-e and AFPb1-e). The distance between the centroids will be hereinafter referred to as a base length.

In the present exemplary embodiment, however, the pupil regions AFPa1-e and AFPb1-e are not separated completely, and have overlapped region RP as a region where the pupil regions AFPa1-e and AFPb1-e overlap with each other. Each of a plurality of light rays passing through the overlapped region RP enters either of the pair of photoelectric conversion units 101a and 101b. In other words, electrical signals photoelectrically-converted in the photoelectric conversion unit 101a include a signal corresponding to a light beam passing through the pupil region AFPb1-e. In a similar manner, electrical signals photoelectrically-converted in the photoelectric conversion unit 101b include a signal corresponding to a light beam passing through the pupil region AFPa1-e. In addition, in the description provided in the present exemplary embodiment, even when a pair of pupil regions for focus detection is described as the pupil regions AFPa1 and AFPb1, the pupil regions includes the actual defocused and spread pupil regions AFPa1-e and AFPb1-e. The same applies to the image sensor 102.

Next, a base length will be described. When a distance between centroids of the respective regions of the photoelectric conversion units 101a and 101b where photoelectric conversion is actually performed is denoted by GS, and a distance between centroids of the pupil regions AFPa1 and AFPb1, i.e., a base length is denoted by GP, the following formula is obtained based on the similarity relationship between two triangles having peaks corresponding to the principal point 101p of the micro lens:

$$GP/PDL = GS/H \quad \text{(Formula 4)}.$$

The base length GP can be calculated by the following formula:

$$GP = GS \times (PDL/H) \quad \text{(Formula 5)}.$$

The term "base length" refers to a distance between entrance pupils of a pair of optical systems in a double-lens stereo camera and an outertype phase difference detection module. Nevertheless, in phase difference type focus detection on an imaging plane in the present exemplary embodiment, the distance GP between a pair of light beams passing through the exit pupil EPL of the imaging lens 500 will be referred to as a base length. In this case, the change in the exit pupil distance PDL, which is a distance between the exit pupil EPL and the imaging plane, changes the base length GP. Thus, when the sizes of base lengths are compared, the exit pupil distances PDL need to be made uniform.

Referring to FIG. 5B, an angle $\alpha$ stretched by the base length GP when viewed from the principal point 101p of the micro lens and an angle $\alpha$ stretched by the distance GS between centroids of the photoelectric conversion units from the principal point 101p of the micro lens are equal to each other. The angle $\alpha$ can also be said to be an apical angle formed by lines connecting the principal point 101p and the respective centroids of the photoelectric conversion units. In addition, even if the exit pupil distance PDL changes, the angle $\alpha$ does not change. In other words, the parallax amount of a pair of images for performing phase difference type focus detection on an imaging plane is proportional to the angle $\alpha$. Thus, as the angle $\alpha$ increases, the base length GP becomes longer, and as the angle $\alpha$ decreases, the base length becomes shorter. In other words, the base length GP described in each exemplary embodiment should be read as the angle $\alpha$, to be exact. Nevertheless, in the present exemplary embodiment, the description will be given using the base length GP instead of the angle $\alpha$ for the sake of simplification.

In addition, in FIGS. 5A and 5B, the description has been given using the example of the image sensor 101. In the image sensor 102, the sizes and the dimensions are different from those of the image sensor 101, but the functions are substantially the same. Thus, the detailed description will be omitted.

FIGS. 6A and 6B are diagrams illustrating an F-number of the imaging lens 500 and a base length of a pair of pupil regions. FIG. 6A is the same diagram as FIG. 5B described above, and illustrates a case in which an F-number of the imaging lens 500 is small, i.e., a case in which an aperture diameter is large and vignetting of the pupil regions is ignorable. The pair of pupil regions are each defocused to spread, and the trails of them generate an overlapped region RP. In addition, a distance between centroids corresponds to a base length GP. FIG. 6B illustrates a case in which an F-number is large, i.e., a case in which an iris diaphragm is stopped down to have a smaller aperture diameter. The pair of pupil regions are symmetrically vignetted from the respective outer regions distant from the optical axis, and the base length becomes shorter according to the vignetting. A base length GP-d in FIG. 6B represents a base length obtainable in a case in which an iris diaphragm is stopped down in this manner to have a smaller aperture diameter. In a case in which an iris diaphragm is stopped down to have a smaller aperture diameter, an overlap portion on the inner sides of the pupil regions remains without being vignetted. Thus, as the aperture diameter becomes smaller, the distance between centroids of the pair of pupil regions rapidly shortens. On the other hand, although the distance between centroids of the pair of photoelectric conversion units remains constant, light beams become unreachable to the outer regions of the photoelectric conversion units (shaded regions in FIG. 6B) due to the vignetting. Thus, a distance GS-d between centroids that is obtainable in consideration of the light amount becomes shorter than the distance GS between centroids in FIG. 6A.

FIGS. 7A and 7B are diagrams illustrating a relationship between the single imaging lens 500 and pupil regions of two image sensors. FIG. 7A illustrates the pupil regions of the image sensor 101, and FIG. 7B illustrates the pupil regions of the image sensor 102. To achieve highly-accurate phase difference autofocus, for example, the following conditions are required. One of the example conditions is that a base length of a pair of pupil regions provided for obtaining a pair of phase difference images needs to be long. Another condition is that focus detection can be performed even in the case of a small diaphragm. Yet another condition is that focus detection performance does not decline even at the end portion of an imaging plane. The structure of a pixel portion for satisfying these performance requirements will be described using FIG. 7A.

FIG. 7A illustrates the exit pupil EPL of the imaging lens 500, and two pixel portions 101-1 and 101-2. The pixel portion 101-1 is a pixel portion disposed at the center of the imaging plane, i.e., at an image height x=0 mm, and the pixel 101-2 is a pixel portion disposed at a location closer to the end of the imaging plane, for example, at an image height x=10 mm. In the pixel portion 101-1, the optical axis of the micro lens 101c falls on the center of the pixel portion (the boundary portion of the pair of photoelectric conversion units), and the characteristics of pupil regions formed by the pixel portion 101-1 are as described above with reference to FIGS. 5A to 6B.

More specifically, after having passed through the pupil region AFPa1 serving as a first pupil region, a light beam reaches the photoelectric conversion unit 101a serving as the first photoelectric conversion unit, to be photoelectrically-converted. After having passed through the pupil region AFPb1 serving as a second pupil region, a light beam reaches the photoelectric conversion unit 101b serving as the second photoelectric conversion unit, to be photoelectrically-converted. Thus, the pupil regions AFPa1 and AFPb1 correspond to focus detection pupils used for phase difference detection. A straight line RYa is a line connecting the center of the photoelectric conversion unit 101a and the center of the pupil region AFPa1, that is, a principal ray of light beams received by the photoelectric conversion unit 101a. Similarly, a straight line RYb is a line connecting the center of the photoelectric conversion unit 101b and the center of the pupil region AFPb1, that is, a principal ray of light beams received by the photoelectric conversion unit 101b. As described above with reference to FIGS. 5A and 5B, a distance between principal rays of a pair of light beams passing through the inside of the region of the exit pupil EPL, i.e., a distance GP1 between the centroids of the pupil regions corresponds to a base length in phase difference detection. In addition, as described later, outputs from the pair of photoelectric conversion units are added by the CPU 104 serving as the addition control unit or a dedicated circuit to be used for obtaining an image signal for recording or display. Thus, the boundary portion separating the pair of photoelectric conversion units corresponds to the center of a photoelectric conversion region in image capturing. For this reason, a light ray passing through the boundary portion of a pair of photoelectric conversion units and the principal point 101p of a micro lens will be referred to as a principal ray of a pixel portion. A principal ray of a pixel portion at the image height x=0 mm corresponds to the optical axis of the imaging lens 500.

Next, the pixel portion 101-2 will be described. A micro lens 101c-o of the pixel portion 101-2 does not correspond to the center of the pixel portion, and is decentered by a predetermined amount dx1 toward the optical axis of the imaging lens 500. Accordingly, a principal ray RYc-o of the pixel portion 101-2 inclines by a predetermined angle ω1 with respect to the optical axis, and intersects with the optical axis at a position distant from the imaging plane by a predetermined distance. A virtual surface orthogonal to the optical axis at the intersection position will be referred to as a sensor pupil surface, and a distance PDS1 between the sensor pupil surface and the imaging plane will be referred to as a sensor pupil distance. In FIG. 7A, the following formula is obtained based on the similarity relationship between two triangles:

$$X/(PDS1+h1)=dx1/h1 \quad \text{(Formula 6)}.$$

In the present exemplary embodiment, due to the decentering amount dx1 of the micro lens 101c-o, the sensor pupil distance PDS1 becomes equal to the exit pupil distance PDL of the imaging lens 500. Thus, based on Formula 5, the decentering amount dx1 of the micro lens 101c-o is obtained as follows:

$$dx1=X \times h1/(PDS1+h1) \quad \text{(Formula 7)}.$$

In addition, due to the decentering of the micro lens 101c-o, principal rays RYa-o and RYb-o of a pair of photoelectric conversion units 101a-o and 101b-o also deviate toward the optical axis direction of the imaging lens 500, and intersect with the principal rays RYa and RYb of the respective photoelectric conversion units of the pixel portion 101-1 on the sensor pupil surface.

A decentering amount dx1 of the micro lens 101c-o of a pixel portion located between the pixel portions 101-1 and 101-2 is proportional to an image height x of the pixel portion. This accordingly means that a principal ray of a pixel portion located at any image height intersects with the optical axis on the sensor pupil surface at the same distance from the imaging plane. In other words, on the sensor pupil surface, pupil regions of all pixel portions substantially correspond to the pupil regions AFPa1 and AFPb1 of a pixel portion at the center of the imaging plane, and the base length of the pupil regions corresponds to the base length GP1. By setting the exit pupil distance PDL of the imaging lens 500 and the sensor pupil distance to be equivalent to the distance PDS1 in this manner, the light amounts of a pair of focus detection light beams become equivalent regardless of an image height. It accordingly becomes possible to perform accurate focus detection even if a focus detection region is at an end portion of the imaging plane.

FIG. 7B is a diagram illustrating a relationship between the imaging lens 500 and the image sensor 102. A light beam headed for the image sensor 102 from the imaging lens 500 is bent by 90 degrees via the beam splitter 103, and a subject image formed on the image sensor 102 is a mirror image. Nevertheless, in this example, the description will be given in a state in which the light beam is developed in a straight line, and the mirror image is returned back to an original normal image. As described above with reference to FIGS. 2A to 2D, the image sensor 102 differs from the image sensor 101 in the size of a pixel portion on the xy-plane. Thus, the respective sizes of the functional units in the pixel portions on the xz cross section are also different.

Similarly to FIG. 7A, FIG. 7B illustrates two pixel portions 102-1 and 102-2. In FIG. 7B, the pixel portion 102-1 is disposed at the center of the imaging plane, i.e., at the image height x=0 mm, and the pixel portion 102-2 is disposed at the image height x=10 mm. In the micro lens 102c of the pixel portion 102-1, the optical axis falls on the pixel portion center (boundary portion of a pair of photoelectric conversion units). As described above with reference to FIG. 4B, a focus position of the micro lens 102c is near the uppermost surfaces of the pair of photoelectric conversion units 102a and 102b. Thus, the exit pupil EPL of the imaging lens 500 and the upper surfaces of the photoelectric conversion units are in an optically substantially conjugate state via the micro lens.

Thus, similarly to the case of the image sensor 101, the pair of photoelectric conversion units 102a and 102b receive light beams having passed through a pair of respective pupil regions AFPa2 and AFPb2. The pupil region AFPa2 and AFPb2 correspond to pupil regions of the pixel portion 102-1. Straight lines RYa and RYb are respective principal rays of light beams received by the photoelectric conversion unit 102a serving as the first photoelectric conversion unit and the photoelectric conversion unit 102b serving as the second photoelectric conversion unit. Thus, a distance between principal rays of a pair of light beams passing through the inside of the region of the exit pupil EPL of the imaging lens 500, i.e., a base length GP2 corresponding to a distance between centroids of the pupil regions corresponds to a base length in phase difference detection. In addition, a straight line RYc is a principal ray of a pixel portion that is used in obtaining an image signal for recording or display, and corresponds to the optical axis of the imaging lens 500.

Similarly to the pixel portion 101-2 of the first image sensor, a micro lens 102c-o of the pixel portion 102-2 is decentered by a predetermined amount dx2 toward the optical axis of the imaging lens 500. Accordingly, a principal ray RYc-o of the pixel portion 102-2 forms a predetermined angle ω2 with respect to the optical axis, and intersects with the optical axis at a position distant from the imaging plane by a distance PSD2. In addition, the decentering amount dx2 of the micro lens of a pixel portion located between the pixel portions 102-1 and 102-2 is proportional to an image height X of the pixel portion, so that relationships similar to Formulae 5 and 6 described above are satisfied. Thus, a principal ray of a pixel portion located at any image height intersects with the optical axis on the sensor pupil surface. In other words, also in the second image sensor, on the sensor pupil surface, pupil regions of all pixel portions substantially correspond to the pupil regions AFPa2 and AFPb2 of a pixel portion at the center of the imaging plane, and the base length of the pupil regions corresponds to the base length GP2.

The relationship between the base lengths GP1 and GP2 will now be described. Since the image sensor 102 has pixel portions with a larger dimension as compared with those of the image sensor 101, dimension ratios in the x and y directions of the photoelectric conversion units with respect to the pixel size (pixel pitch) in the pixel portions included in the second image sensor can be made larger as compared with those in the pixel portions included in the image sensor 101. In the present exemplary embodiment, the x direction dimensions of the photoelectric conversion units 102a and 102b of the image sensor 102 are larger than the x direction dimensions of the photoelectric conversion units 101a and 101b of the image sensor 101. As a result, pupil regions on the sensor pupil surface are also larger, and the base length GP2 of the image sensor 102 is longer than the base length GP1 of the image sensor 101.

In addition, for the reason similar to the image sensor 101, predetermined blur is generated also in the pupil regions of the image sensor 102, and the pair of pupil regions overlap with each other by an overlap amount of overlapped region RP2. The overlap amount of overlapped region RP2 is smaller than the overlap amount of overlapped region RP1 in the first image sensor 101.

The reason why the overlap amount in the image sensor 101 is larger than that in the image sensor 102 in the present exemplary embodiment lies in the fact that an out-of-focus amount in the image sensor 101 is larger than that in the image sensor 102. As described above, in the image sensor 101, the focus position of the micro lens is deeper toward the photoelectric conversion units with respect to the micro lens, i.e., is in back focus state, as compared with the image sensor 102. In the image sensor 101, by canceling the optically-conjugate state of the exit pupil EPL and the upper surfaces of the photoelectric conversion units, the pupil regions are defocused.

Reverse projection images of the photoelectric conversion units of the image sensor 101 that are reversely projected at the same position as the exit pupil EPL with respect to the optical axis direction also have a three dimensional shape extending also in the z-axis direction more than that in the case of the image sensor 102. Thus, the reverse projection images are more defocused than those in the case of the image sensor 102. In other words, in a similar manner, the corresponding pupil regions AFPa1 and AFPb1 of the image sensor 101 also become regions extending in the z-axis direction more than the pupil regions AFPa2 and AFPb2 of the image sensor 102. With this configuration, in the image sensor 101, the out-of-focus amounts of the pupil regions become larger than those in the image sensor 102.

For the above-described reason, the pupil regions AFPa1 and AFPb1 of the image sensor 101 have larger out-of-focus amounts as compared with the pupil regions AFPa2 and AFPb2 of the image sensor 102. Thus, the overlap amount of overlapped region RP of the pupil regions in the image sensor 101 is larger than that in the image sensor 102.

As described above, in an image sensor for performing phase difference type focus detection on an imaging plane, a sensor pupil distance, a base length of pupil regions, and an overlap amount of the pupil regions are important characteristic values for determining focus detection performance. In addition, these characteristic values depend on the arrangements and dimensions of functional units in pixel portions included in the image sensor. In the present exemplary embodiment, as for the first image sensor 101 and the second image sensor 102, sensor pupil distances are substantially equivalent, as described above. On the other hand, a base length for phase difference detection in the image sensor 102 is larger than that in the image sensor 101, and an overlap amount of pupil regions in the image sensor 101 is larger. That is, these relationships are represented by the following formulae:

$$PDS1 \approx PDS2 \quad \text{(Formula 8),}$$

$$GP1 < GP2 \quad \text{(Formula 9), and}$$

$$RP1 > RP2 \quad \text{(Formula 10).}$$

In addition, the overlap and the base length of pupil regions will be further described with reference to FIGS. 8A to 8D and subsequent diagrams.

Figure 8A:
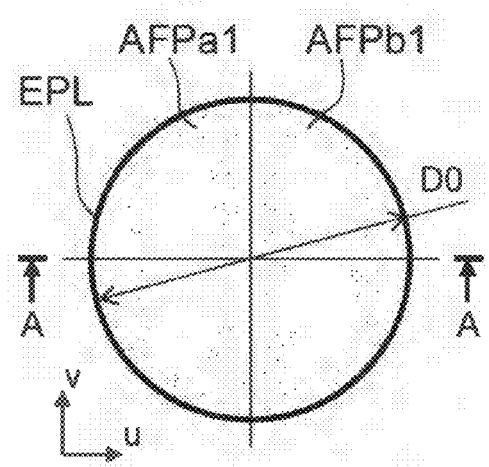
FIGS. 8A, 8B, 8C, and 8D are diagrams illustrating plane shapes and light-receiving efficiencies of pupil regions of the image sensors 101 and 102.
Figure 8C:
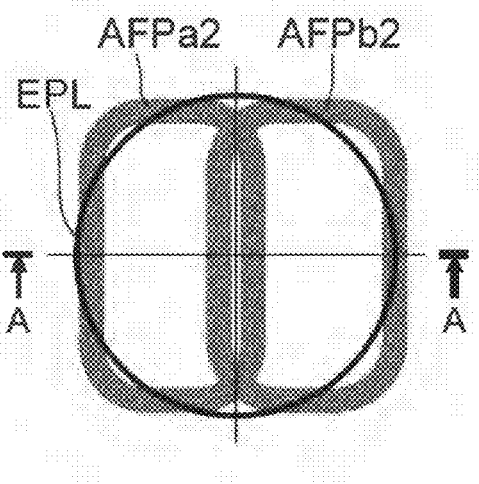
Figure 8B:
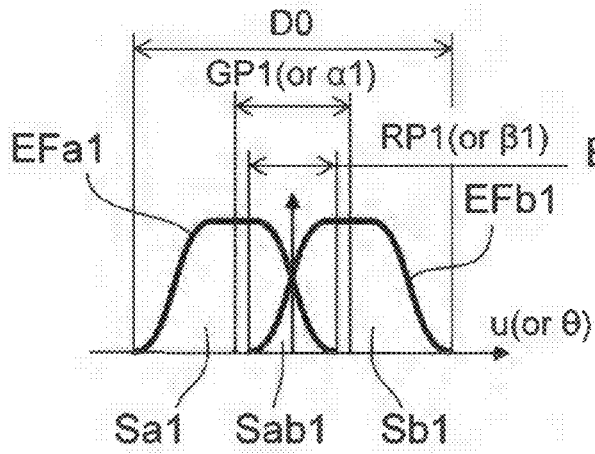

FIGS. 8A to 8D are diagrams illustrating the broadening and light-receiving characteristics of pupil regions. FIG. 8A is a plan view of pupil regions on a sensor pupil surface of the image sensor 101, and FIG. 8B is a diagram illustrating light-receiving characteristics of the pupil regions.

The exit pupil EPL of the imaging lens 500 is indicated by a circle having a diameter D0 with coordinate axes in the plane illustrated in FIG. 8A corresponding to uv axes. The plane shapes of the photoelectric conversion units 101a and 101b corresponding to the pupil regions AFPa1 and AFPb1 are two rectangles separated in the x direction on the xy-plane of the imaging plane, as illustrated in FIG. 2A. Nevertheless, as described above, pupil regions are defocused for various reasons. Thus, as illustrated in FIG. 8A, the pupil region outer peripheral shapes of the pupil regions AFPa1 and AFPb1 are defocused to broaden. In addition, the four corners are rounded and overlap is generated at a neighboring portion.

FIG. 8B illustrates light-receiving efficiencies of the pupil regions AFPa1 and AFPb1 in an A-A cross section in FIG. 8A. A horizontal axis indicates an X-coordinate on the sensor pupil surface, and a vertical axis indicates light-receiving efficiencies of the pupil regions AFPa1 and AFPb1. In the present exemplary embodiment in which phase difference type focus detection is performed on an imaging plane, the imaging lens 500 and a pair of photoelectric conversion units virtually divide the exit pupil EPL of the imaging lens 500 into a pair of regions via a micro lens, and the obtained divided regions are defined as pupil regions as described above. In addition, the pupil regions have been described to have predetermined blur. This means that light beams passing through defocused regions of the pupil regions have declined light-receiving efficiencies of light beams in the photoelectric conversion units. In view of this, FIG. 8B illustrates the defocus of the pupil regions in terms of light-receiving efficiency. EFa1 denotes the light-receiving efficiency of the pupil region AFPa1, and EFb1 denotes the light-receiving efficiency of the pupil region AFPb1. In each pupil region, the light-receiving efficiency becomes higher toward the center portion thereof, and gradually declines toward peripheral portions with trails. In addition, a centroid of a region surrounded by each light-receiving efficiency curve corresponds to a centroid of a corresponding pupil region, and a base length GP1, i.e., a distance GP1 between the centroids of the pair of pupil regions corresponds to a base length in phase difference detection. Strictly speaking, if the light-receiving efficiencies are integrated while the A-A cross section line being shifted on the v axis in FIG. 8A, a distance in the u direction between centroids of the integration results corresponds to the base length GP1. In FIGS. 8A to 8D, the imaging lens 500 is assumed to have a small F-number. Thus, the diameter D0 of the exit pupil EPL is sufficiently longer than the base length GP1. In addition, at the trail portions where the light-receiving efficiency curves of the pair of pupil regions are adjacent to each other, overlapped region with a width RP1 is generated.

Figure 8D:
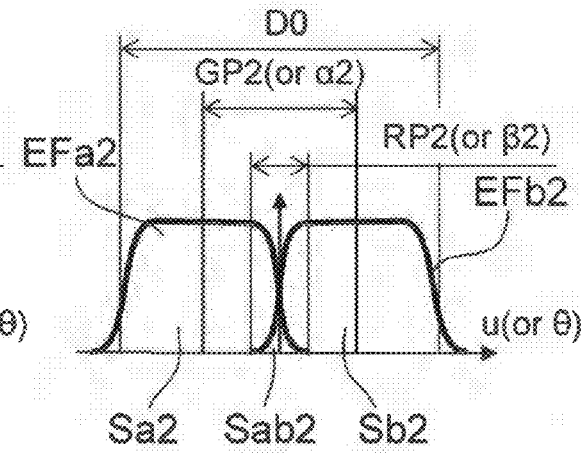

FIG. 8C is a plan view of pupil regions of the image sensor 102, and FIG. 8D is a diagram illustrating characteristics of the pupil regions. FIGS. 8C and 8D respectively correspond to FIGS. 8A and 8B in the image sensor 101. When light-receiving efficiency curves illustrated in FIGS. 8B and 8D are compared with each other, as for the base lengths, the base length GP2 of the image sensor 102 is longer than the base length GP1 of the image sensor 101. On the other hand, broadening shapes of the trails of the light-receiving efficiency curves differ from each other, and as for an overlap amount of the trail portions, the overlap amount of overlapped region RP2 of the image sensor 102 is smaller than the overlap amount of overlapped region RP1 of the image sensor 101. If there is no vignetting of the pair of pupil regions near the open state of the diaphragm of the imaging lens 500, base lengths at the time of focus detection in the image sensors 101 and 102 are long enough. On the other hand, as the diaphragm of the imaging lens 500 is stopped down, the pair of pupil regions becomes vignetted from the outer sides thereof. Thus, the base lengths GP1 and GP2 shorten in accordance with the increase in F-number, and the decrease degree of the base length GP1 is more significant than that of the base length GP2.

In addition, in the description given in the present exemplary embodiment, the overlap amounts of pupil regions are defined as the distances of overlapped region RP1 and RP2 between ends of the respective trails of the pupil regions. The overlap amounts, however, are not limited to this definition. Generally, it is difficult to strictly define the edge positions of trails of a waveform, i.e., positions where response becomes zero. Thus, positions at a relative height with respect to the highest point of each waveform, for example, positions at the 10% height of the highest point may be defined as the trails of the waveform, and a distance between the trails may be defined as an overlap amount of pupil regions. Alternatively, the overlap amount can be defined by the ratio of an overlap region area of both waveforms with respect to an area of one waveform. This example will be described with reference to FIG. 8B. When an area of a portion surrounded by the light-receiving efficiency waveform EFa1 corresponding to the pupil region AFPa1 is denoted by Sa1, an area of a portion surrounded by the light-receiving efficiency waveform EFb1 corresponding to the pupil region AFPb1 is denoted by Sb1, and an area of an overlap portion (shared region) of the both waveforms is denoted by Sab1, an overlap ratio SR1 of the pupil regions is defined by the following formula:

$$SR1 = Sab1/((Sa1+Sb1)/2) \quad \text{(Formula 11)}.$$

In other words, an overlap ratio refers to a ratio of an area of an overlap portion region of the regions surrounded by light-receiving efficiency curves of the pair of pupil regions, with respect to an area obtained by adding the areas of the regions surrounded by the respective light-receiving efficiency curves of the pair of pupil regions and dividing the obtained area by 2. According to the definition, if the pair of pupil regions are fully separated, SR1=0 is obtained, and if the pair of pupil regions are fully overlapped, SR1=1 is obtained. In the example illustrated in FIG. 8B, about SR1=0.15 is obtained.

Also in the second image sensor illustrated in FIG. 8D, when the overlap ratio SR2 of the pupil regions is defined by the following formula, about SR2=0.08 is obtained:

$$SR2 = Sab2/((Sa2+Sb2)/2) \quad \text{(Formula 12)}.$$

Accordingly, the relationship between the overlap ratios of the pupil regions of the two image sensors is represented by the following formula:

$$SR1 > SR2 \quad \text{(Formula 13)}.$$

The relationship is a magnitude relationship similar to that defined by Formula 10. In other words, in the present exemplary embodiment, when the observation is made on the A-A cross section, which is a cross section passing through a line connecting centroids of the pair of pupil regions, the overlap ratio in the image sensor 101 is larger than the overlap ratio in the second image sensor 102. Next, a relationship between a defocus amount and an image shift amount will be described using FIGS. 9A and 9B. As illustrated in FIG. 9A, light beams having emitted from a subject and passed through the pupil regions AFPa1 and AFPb1 intersect with each other on a focus surface JP. Meanwhile, if an imaging plane IP of an image sensor, i.e., a planned image forming plane is shifted from the focus surface JP, the shift amount DEF corresponds to a defocus amount, and principal rays of the pupil regions that have reached the imaging plane are separated from each other by an amount cp. The following formula is obtained based on the similarity relationship between two triangles having peaks corresponding to the focus surface:

$$GP/(PDL-DEF) \approx GP/PDL = \phi/DEF \qquad \text{(Formula 14)}.$$

The separation amount $\phi$ is calculated by the following formula:

$$\phi = DEF \times (GP/PDL) \qquad \text{(Formula 15)}.$$

Thus, it can be seen that the separation amount $\phi$ is proportional to the base length GP and the defocus amount DEF.

While FIG. 9A illustrates the case of a point image, in focus detection, information about an image extending in the x direction within a focus detecting field is used. Thus, in a plurality of pixel portions adjacent in the x direction, a signal (referred to as an A image) obtained by connecting output signals from the first photoelectric conversion units included in the respective pixel portions and a signal (referred to as a B image) obtained by connecting output signals from the second photoelectric conversion units are generated. FIG. 9B conceptually illustrates intensity distributions of the A image and the B image obtained in this case. In FIG. 9B, Sa denotes the A image signal and Sb denotes the B image signal, and the both signals are shifted from each other in the x direction by the amount cp. The image shift amount $\phi$ is equal to the light ray separation amount $\phi$ illustrated in FIG. 9A. Thus, a relative shift amount $\phi$ in the x direction of the A image and the B image is calculated using a known correlation calculation algorithm. Then, the defocus amount DEF is calculated using the following formula obtained by modifying Formula 15:

$$DEF = \phi \times (PDL/GP) \qquad \text{(Formula 16)}.$$

By driving a focus lens group using a value obtained by multiplying the calculated defocus amount DEF by a coefficient specific to each focus lens, a subject image can be caused to correspond to the imaging plane to be in focus.

Figure 10B:
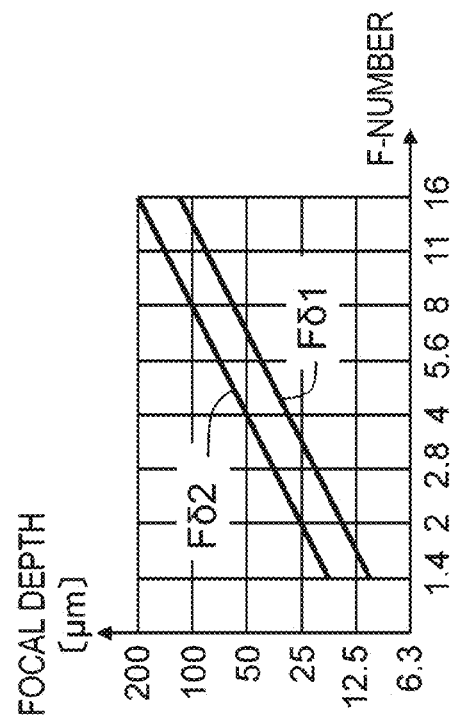
FIGS. 10A, 10B, and 10C are diagrams illustrating a relationship between an F-number and a base length.
Figure 10C:
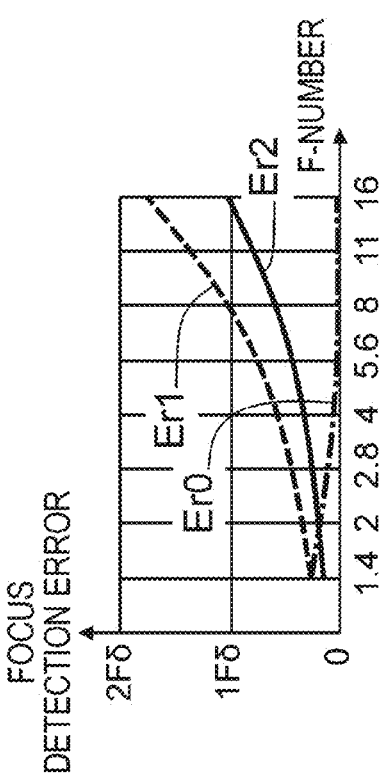
Figure 10A:
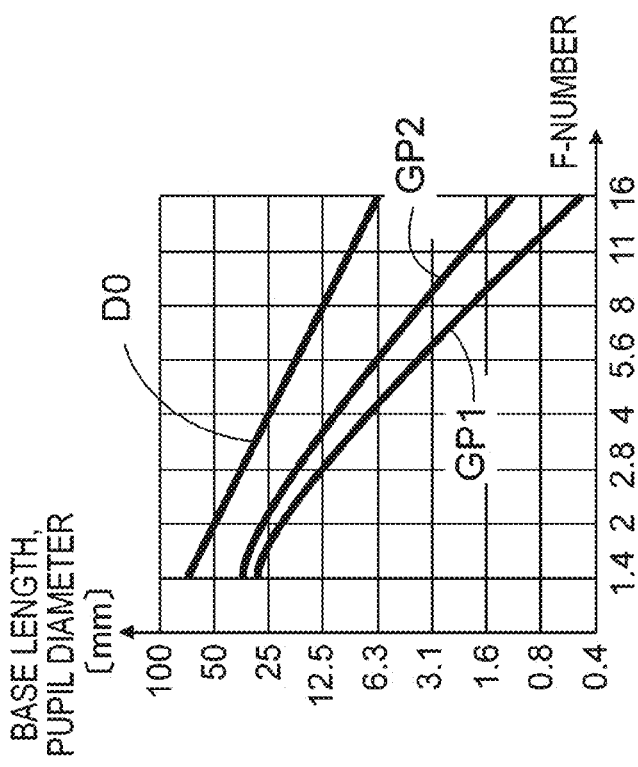

FIGS. 10A to 10C are diagrams illustrating relationships of base lengths of pupil regions and focus detection accuracy to an F-number of the imaging lens 500. FIG. 10A is a diagram illustrating the changing statuses of the base lengths of the pupil regions in the image sensors 101 and 102 with respect to an F-number of the imaging lens 500. A horizontal axis represents F-numbers of the imaging lens 500 with 1 scale corresponding to 1 level of F-numbers, and a vertical axis represents base lengths with a logarithmic scale with 1 scale corresponding to double or half change. GP1 and GP2 in FIG. 10A denote respective base lengths of the pair of pupil regions in the image sensors 101 and 102. In addition, for reference, the diameter of the exit pupil EPL of the imaging lens 500 is denoted by D0. In the imaging lens 500 according to the present exemplary embodiment, a focal length and the exit pupil distance PDL are both set to 100 mm, and an open F-number is set to F1.4. If the diaphragm is stopped down by 2 levels, i.e., an F-number is set to a numerical value larger by 2 levels, an effective diameter of the imaging lens 500 is halved. Thus, the diameter D0 is represented by a straight line with inclination of −0.5.

Meanwhile, the base lengths GP1 and GP2 also decrease as the diaphragm of the imaging lens 500 is stopped down, but the decrease degrees of the base lengths GP1 and GP2 are larger than the decrease rate of the diameter D0, and the base length GP1 decreases more significantly than the base length GP2. This is because the defocus amounts of pupil regions in the image sensor 101 are larger than those in the image sensor 102, and as the diaphragm becomes smaller, the pupil regions are incompletely separated, and the base lengths shorten. In other words, in the present exemplary embodiment, over the entire region from an open state to a small diaphragm, the base length in the second image sensor 102 is smaller than that in the image sensor 101, and a difference (strictly speaking, ratio) between the base lengths of the both image sensors become more prominent as the diaphragm becomes smaller. Thus, in the entire F-number region, the focus detection accuracy in the image sensor 102 is higher than that in the image sensor 101. In this manner, the image sensor 102 can be said to be centered on focus detection performance.

FIG. 10B is a diagram illustrating a relationship between an F-number of the imaging lens 500 and a focal depth. A horizontal axis represents F-numbers of the imaging lens 500 with 1 scale corresponding to 1 level of F-numbers, and a vertical axis represents focal depths with a logarithmic scale with 1 scale corresponding to double or half change. As described above with reference to FIG. 10A, in the present exemplary embodiment in which phase difference type focus detection is performed on an imaging plane, as a diaphragm is stopped down, base lengths decrease and focus detection accuracy declines, but a focal depth of an image becomes deeper as the diaphragm is stopped down. Thus, a permissible error in focus detection becomes larger. When an F-number of the imaging lens 500 is denoted by F and a permissible confusion circle diameter of an image is denoted by δ, a focal depth is denoted by ±Fδ with reference to an in-focus point, and this can be regarded as a permissible value of defocus. There are various definition methods of a permissible confusion circle. In this example, a permissible confusion circle is assumed to be the double of the pixel size of an image sensor. In the present exemplary embodiment, since the pixel size of the image sensor 101 is 4 μm, a permissible confusion circle diameter is 8 μm, and since the pixel size of the image sensor 102 is 6 μm, a permissible confusion circle diameter is 12 μm.

A focal depth Fδ1 in FIG. 8B is a focal depth of the image sensor 101, and when an aperture value is F1.4 in the open state, the focal depth becomes ±11.2 μm, and when the aperture value is F4, the focal depth becomes ±32 μm. In a similar manner, a focal depth Fδ2 is a focal depth of the image sensor 102, and when an aperture value is F1.4 in the open state, the focal depth becomes ±11.2 μm, and when the aperture value is F4, the focal depth becomes ±32 μm. If the diaphragm is stopped down by 2 levels, i.e., an F-number is set to a numerical value larger by 2 levels in this manner, an effective diameter of the imaging lens 500 is halved. Thus, a focal depth graph is represented by a straight line with inclination of +0.5. In addition, a size obtainable when comparison is made using a predetermined F-number is proportional to a pixel size.

According to FIG. 10A, since the base length of the pair of pupil regions decreases in accordance with the increase in F-number, focus detection accuracy accordingly declines. On the other hand, since a focal depth becomes deeper in accordance with the increase in F-number as illustrated in FIG. 10B, a permissible error of focus detection accordingly increases. FIG. 10C conceptually illustrates a focus detection error and a permissible value of the error considering the above-described conditions. A horizontal axis represents F-numbers of the imaging lens 500 with 1 scale corresponding to 1 level of F-numbers, and a vertical axis represents a focus detection error normalized by a permissible depth of each F-number, with a straight scale with 1 Fδ corresponding to a permissible value. In FIG. 10C, a broken line curve Er1 represents a focus detection error of the image sensor 101, and a solid line curve Er2 represents a focus detection error of the image sensor 102. The normalized focus detection error increases in accordance with the increase in F-number, and the focus detection error Er1 exceeds the permissible value at F8, but the focus detection error Erg remains within the permissible value until F16. In other words, if focus detection is performed by the image sensor 101 for still images during still image recording, focusing accuracy may fail to satisfy a standard when the diaphragm is small. Nevertheless, if focus detection is performed while the diaphragm is controlled to an opening side during still image recording, the normalized error can fall within the permissible value. A dashed-dotted line Er0 represents a focus detection error in the case of performing AF in the diaphragm open state and performing image capturing after stopping down the diaphragm to a predetermined F-number. A diaphragm control timing during still image recording will be described with reference to a control flowchart illustrated in FIG. 12.

According to Formula 16, information about the base length is required for calculating a defocus amount from a detected image shift amount. FIGS. 10A to 10C illustrate the state in which base lengths change according to F-numbers. Thus, in the imaging apparatus according to the present exemplary embodiment, PDL/GP in Formula 16 is represented by K, and the obtained values are stored as constants for each image sensor and each F-number in a look-up table as illustrated in FIG. 11.

As described above with reference to FIG. 10A, base lengths differ between the image sensors 101 and 102, and vary depending on the F-number of the imaging lens 500. Thus, the look-up table illustrated in FIG. 11 has constants for each image sensor and for each level of F-number. More specifically, K11 to K18 are proportional constants of the image sensor 101 in respective F-numbers, and K21 to K28 are proportional constants of the image sensor 102 in the respective F-numbers. Using an image shift amount $\phi$ detected for the image sensor 101 or 102, and an F-number set at the time, a corresponding constant K is read out from the table illustrated in FIG. 11, and a defocus amount can be calculated using the following formula:

$$DEF = \phi \times K \quad \text{(Formula 17)}.$$

In addition, according to the above formula, as a proportional constant K becomes smaller, a calculated defocus amount DEF becomes smaller. This means that the smaller the constant K is, the higher focus detection resolution is, that is, the higher focus detection accuracy is.

Figure 12:
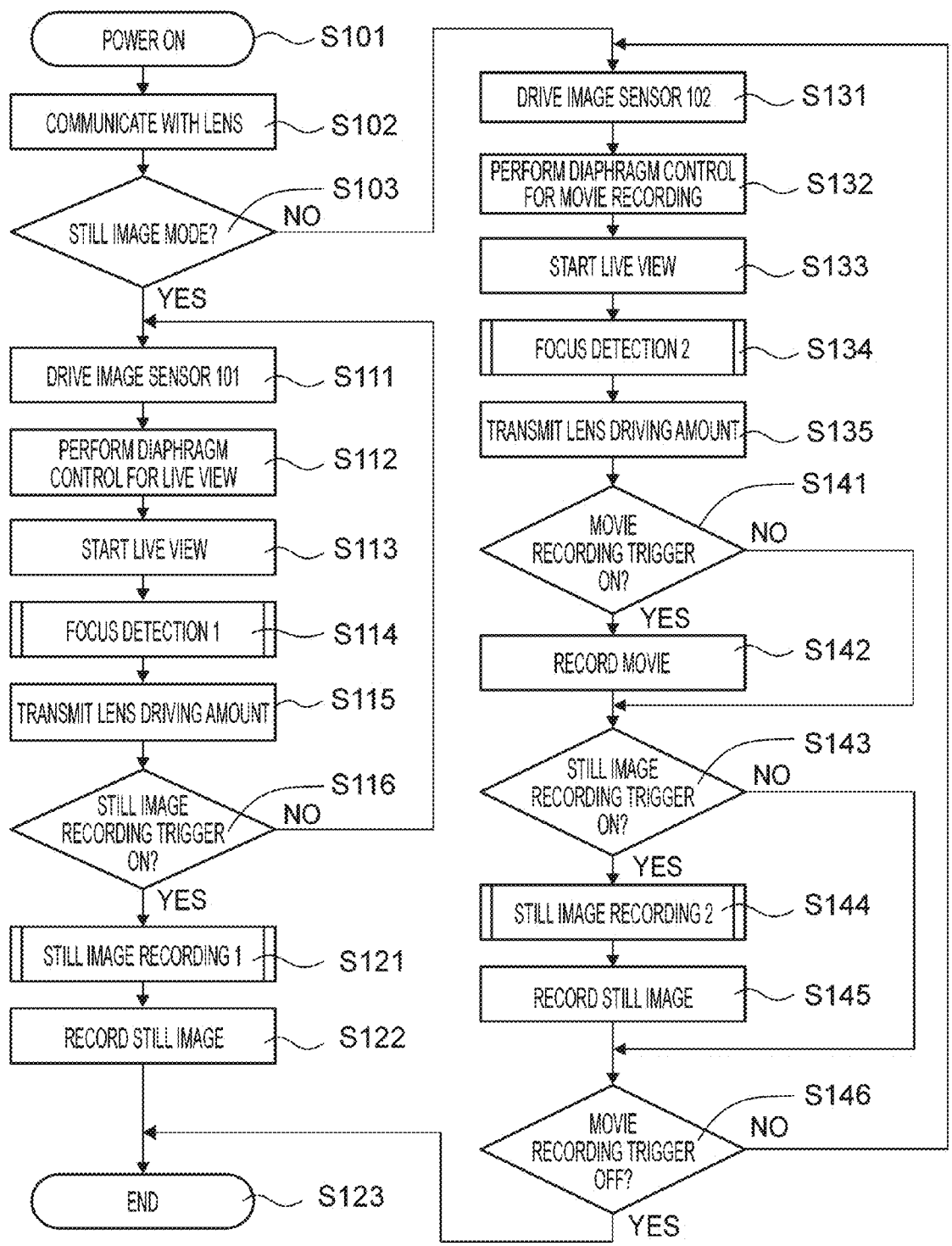
FIG. 12 is a main flowchart relating to image capturing.

FIG. 12 is a main flowchart illustrating the procedure of image capturing processing according to the present exemplary embodiment. In step S101, if a photographer performs an ON operation of a power switch (not illustrated) of the camera main body 100, the camera CPU 104 checks the operations of each actuator (not illustrated) and the image sensors 101 and 102 in the camera main body 100, and initializes memory contents and execution programs.

In step S102, the camera CPU 104 communicates with the lens CPU 507 to receive information such as an open F-number of an interchangeable lens, a focal length, the exit pupil distance PDL, and focus sensitivity, which is a proportional constant of a focus lens driving amount and a focus change amount.

In step S103, it is determined whether an image capturing mode is a still image mode or a movie mode. If the image capturing mode is the still image mode (YES in step S103), the processing proceeds to step S111. If the image capturing mode is the movie image mode (NO in step S103), the processing proceeds to step S131. If the still image mode is set, the flow subsequent to step S111 is executed.

In step S111, the image sensor 101 for still image recording is driven in a live view mode. The live view refers to a mode in which an image acquired by an image sensor is displayed in real time on the in-viewfinder display 107 or the external display 110 illustrated in FIG. 1. The number of pixels of the display device is smaller in both horizontal and vertical directions than the number of pixels of an image for recording. Thus, in the live view mode, the pixels are thinned out both in the horizontal and vertical directions when the pixels are read out from the image sensor, so that power consumption of the image sensor and a signal processing circuit are reduced. In addition, phase difference detection is also performed using an image signal read out in the live view mode. Alternatively, information of all the pixels may be read out without performing thinned-out reading only for a focus detection region, to maintain the resolution of focus detection signals.

In step S112, brightness of the image signal acquired in step S111 is determined, and diaphragm control for live view is performed. Steps S111 to S115 are steps in which live view and focus adjustment during still image recording are performed. During still image recording, there is no major problem even if the diaphragm varies between live view and still image recording. On the other hand, in an image sensor for still images, since a pixel size is small and the number of recording pixels is large, a permissible value of a focusing error is small. Thus, in step S112, diaphragm control is performed so that an F-number of the imaging lens 500 becomes small, that is, an aperture diameter becomes large. More specifically, an F-number of the imaging lens 500 is set to an F-number closer to the open state, and the determined F-number information is transmitted to the lens CPU 507 via the camera side communication terminal 113 and the lens side communication terminal 508. Upon receiving the information, the interchangeable lens 500 drive-controls the diaphragm driving unit 506, and controls an aperture diameter of an iris diaphragm to a predetermined value. Then, if the amount of light passing through an imaging optical system becomes large to be overexposure, an amplifier gain for amplifying signals of the image sensor is set to be lower, and an accumulation time of an electronic shutter for controlling an exposure time is shortened.

In step S113, the signal acquired by the image sensor 101 is converted into a signal for display, and the converted signal is transmitted to the in-viewfinder display 107 or the external display 110 to start live view display In step S114, a subroutine of focus detection 1 suitable for still image recording is executed. The details of this subroutine will be described with reference to FIG. 13.

In step S115, a focus lens driving amount calculated in step S114 is transmitted to the lens CPU 507 via the camera side communication terminal 113 and the lens side communication terminal 508. Upon receiving the focus lens driving amount, the interchangeable lens 500 drives the focus driving unit 504 by the predetermined amount to correct the defocused state.

In step S116, it is determined whether a still image recording start trigger button has been turned on by a user. Then, if the still image recording start trigger button has not been turned on (NO in step S116), the processing returns to step S111, and the live view display and focus adjusting operation in steps S111 to S115 are repeatedly executed. If the still image recording start trigger button has been turned on (YES in step S116), the processing proceeds from step S116 to step S121.

In step S121, a subroutine of still image recording 1 is executed. The details of this subroutine will be described with reference to FIG. 14.

In step S122, the camera CPU 104 processes a signal acquired in step S121, and the camera CPU 104 serving as a first generation unit for generating a still image signal or a second generation unit for generating a movie signal generates a recording image, and records the generated recording image on the storage medium 106 serving as a memory unit. In addition, a dedicated circuit may be provided, and the signal processing and the generation of recording images may be performed by the circuit. In this case, a dedicated circuit serving as the first generation unit and a dedicated circuit serving as the second generation unit may be configured to be operable approximately concurrently with each other. More specifically, the following processing is performed. Since each pixel portion of the image sensor 101 includes a pair of two photoelectric conversion units for phase difference detection, output signals from each pixel portion are also formed of a pair of two signals. Thus, the camera CPU 104 or a dedicated circuit that serves as the addition control unit adds a pair of signals of each pixel portion to obtain an image signal for recording or display of each pixel portion. Next, processing such as color conversion for de-mosaicing color information in the Bayer array, gamma correction, and compression is performed to generate an image for recording.

Then, in step S123, still image recording ends.

Next, the flow of movie recording will be described. If it is determined in step S103 that a movie recording mode is set (NO in step S103), the processing proceeds from step S103 to S131.

In step S131, the image sensor 102 for movie recording is driven in the live view mode.

In step S132, diaphragm control for movie recording is performed. During movie recording, the diaphragm remains the same between live view and movie recording. Thus, in this step, an aperture value suitable for movies is selected. If an exposure time of an electronic shutter is made too short during movie recording, the continuity of a moving subject is lost. As a result, an unnatural movie is generated. For example, stop-motion still images are rapidly played frame by frame. Thus, the time of an electronic shutter is selected so as to avoid such a phenomenon, and an aperture value of the imaging lens 500 and an amplifier gain of the image sensor are appropriately controlled so as to achieve appropriate exposure. The F-number determined in this step is transmitted to the lens CPU 507 via the camera side communication terminal 113 and the lens side communication terminal 508. Upon receiving the F-number, the interchangeable lens 500 drive-controls the diaphragm driving unit 506, and controls the aperture diameter of the iris diaphragm to a predetermined value.

In step S133, the camera CPU 104 converts the signal acquired by the image sensor 102, into a signal for display, and transmits the converted signal to the in-viewfinder display 107 or the external display 110 to start live view display.

In step S134, a subroutine of focus detection 2 suitable for movie recording is executed. The details of this subroutine will be described with reference to FIG. 15.

In step S135, the camera CPU 104 transmits a focus lens driving amount calculated in step S134, to the lens CPU 507 via the camera side communication terminal 113 and the lens side communication terminal 508. Upon receiving the focus lens driving amount, the interchangeable lens 500 drives the focus driving unit 504 by a predetermined amount to correct the defocused state.

In step S141, it is determined whether a movie recording trigger button has been turned on. Then, if the movie recording start trigger button has been turned on (YES in step S141), in step S142, the camera CPU 104 performs image processing for movies, and the camera CPU 104 serving as the second generation unit for generating movie signals generates a movie being a recording image. After the generated movie is recorded, the processing proceeds to step S143. If the movie recording start trigger button has not been turned on (NO in step S141), the processing jumps from step S141 to step S143 without performing movie recording.

In step S143, it is determined whether the still image recording start trigger button has been turned on. In the present exemplary embodiment, if still image recording is instructed during live view for movies or during movie recording, still image recording by the image sensor 101 is enabled. Thus, if the still image recording start trigger button has been turned on (YES in step S143), the processing proceeds from step S143 to step S144.

In step S144, a subroutine of still image recording 2 is executed. In this subroutine, unlike the subroutine of the still image recording 1 performed in step S121, the camera CPU 104 serving as a first control unit performs control so as to perform still image recording concurrently with movie recording in a state in which the movie recording mode is selected. The details of the subroutine will be described with reference to FIG. 16.

In step S145, the camera CPU 104 processes a still image signal acquired in step S144, and the camera CPU 104 serving as the first generation unit for generating a still image signal generates a still image for recording, and records the generated still image on the storage medium 106 serving as a memory unit. In addition, a dedicated circuit may be provided and the signal processing and the generation of recording images may be performed by the circuit. The specific processing procedure is similar to step S122 described above.

After the execution of step S145, the processing proceeds to step S146, and it is determined whether the movie recording trigger button has been turned off. Then, if the on-state is continuing (NO in step S146), the processing in steps S131 to S145 is repeatedly executed. AF control for a movie and movie recording are continued, and the interrupt of a still image is allowed. Then, if it is determined in step S146 that the movie recording trigger button has been turned off (YES in step S146), the processing proceeds to step S123, in which movie recording ends.

Figure 13:
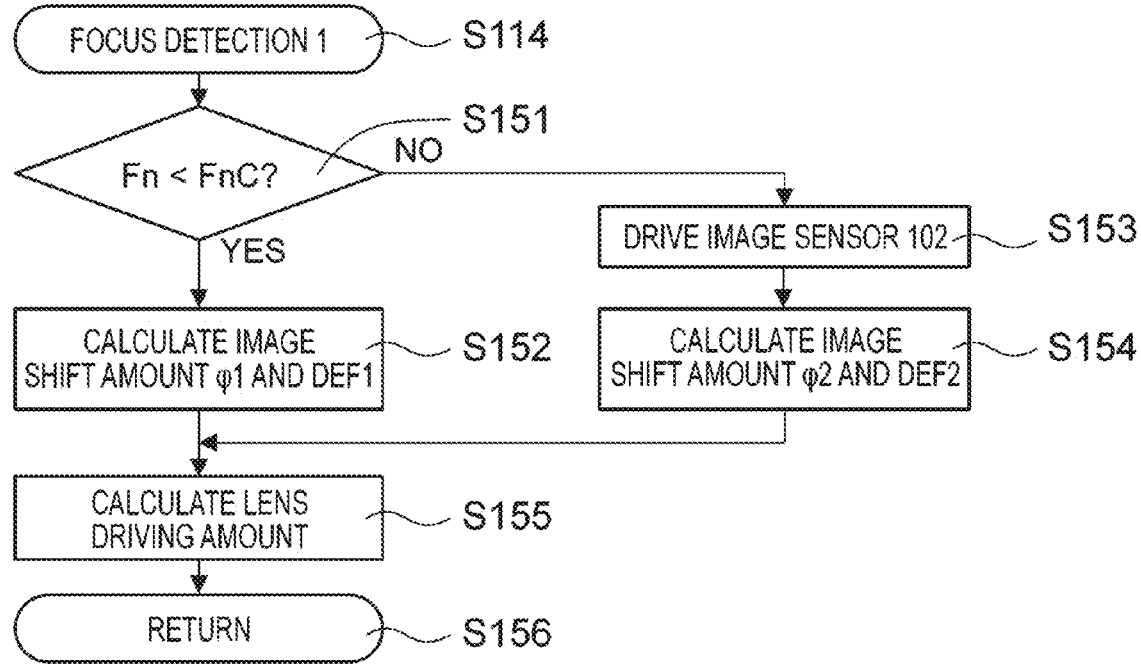
FIG. 13 is a flowchart illustrating a subroutine of "focus detection 1".

FIG. 13 is a flowchart of "focus detection 1", and illustrates the subroutine executed in step S114 in FIG. 12.

When the processing proceeds from step S114 to step S151, an F-number Fn of the imaging lens 500 being controlled in live view and a predetermined F-number FnC are compared with each other in size. Then, if the current F-number Fn is a first F-number smaller than the predetermined value FnC, i.e., if an aperture diameter is equal to or larger than a predetermined value (YES in step S151), the processing proceeds to step S152.

In step S152, the camera CPU 104 serving as a second control unit performs control so as to perform focus detection using a signal detected from the image sensor 101 for still images. More specifically, the camera CPU 104 generates a pair of focus detection signals (the A image and the B image) from the signal acquired by the image sensor 101 for still images, and calculates an image shift amount φ1 using a known correlation calculation algorithm. Then, the camera CPU 104 reads out a conversion coefficient corresponding to the current F-number, from among the conversion coefficients listed in FIG. 11, and calculates a defocus amount DEF using the above-described Formula 17. Then, the processing proceeds to step S155. In step S155, the defocus amount is converted into a focus lens driving amount, and in step S156, the processing returns to the main flow.

On the other hand, if it is determined in step S151 that the current F-number Fn is a second F-number equal to or larger than the predetermined value FnC, i.e., the aperture diameter is equal to or smaller than the predetermined value (NO in step S151), the camera CPU 104 serving as the second control unit performs control in the following manner. The camera CPU 104 performs control so as to perform focus detection using a signal detected from the image sensor 102 for movies for the following reason. As described above with reference to FIGS. 8A to 8D, as an F-number increases, the base length of pupil regions of the image sensor 101 for still images rapidly shorten, and a focus detection accuracy decline becomes more prominent as compared with that of the image sensor 102 for movies. If it is determined in step S151 that the current F-number Fn is equal to or larger than the predetermined value FnC, the processing proceeds to step S153.

In step S153, the image sensor 102 for movies is driven, and pixel signals in a predetermined focus detection region are read out. In step S154, a pair of focus detection signals is generated from the read-out pixel signals, and an image shift amount φ2 is calculated. Then, the camera CPU 104 reads out a conversion coefficient corresponding to the current F-number, from among the conversion coefficients listed in FIG. 11, and calculates a defocus amount DEF using the above-described Formula 17. Then, the processing proceeds to step S155. In step S155, the camera CPU 104 or the lens CPU 507 converts the defocus amount into a focus lens driving amount, and in step S156, the processing returns to the main flow.

As described above, in the present exemplary embodiment, depending on whether the current F-number Fn is smaller than the predetermined value FnC, or equal to or larger than the predetermined value FnC, the camera CPU 104 serving as the second control unit performs control so as to determine which of the image sensors 101 and 102 is to be used in focus detection. In other words, when the F-number is the minimum value of the imaging lens 500 attached at the time, the camera CPU 104 serving as the second control unit performs control so as to perform focus detection using signals detected from the image sensor 101 for still images. When the F-number is the maximum value of the imaging lens 500 attached at the time, the camera CPU 104 serving as the second control unit performs control so as to perform focus detection using signals detected from the image sensor 102 for movies.

As described above, in focus detection in a still image recording mode, if an F-number is small and focus detection accuracy in the image sensor 101 for still images is sufficient, focus detection signals of the image sensor 101 for still images are used. Power is selectively supplied to the image sensor 101 for still images, and the image sensor 102 for movies is not driven. Thus, the increase in power consumption can be suppressed. On the other hand, if an F-number is large and focus detection accuracy in the image sensor 101 for still images is insufficient, the image sensor 102 for movies is driven, and focus detection signals of the image sensor 102 are used. Power is supplied not only to the image sensor 101 for still images that is used for image capturing, but also to the image sensor 102 for movies, and the image sensor 102 for movies is used for focus detection. The focus detection accuracy is thereby maintained. In this manner, the imaging apparatus according to the present exemplary embodiment has a first power supply mode in which power is selectively supplied to either one of two image sensors for driving either one of the two image sensors according to an image capturing mode and an F-number of a lens, for focus detection and image capturing. In addition, the imaging apparatus has a second power supply mode in which power is supplied to both of the two image sensors for driving and using both of the two image sensors. By selectively using the two power supply modes, power consumption can be further suppressed while maintaining image quality and focus detection performance.

Figure 14:
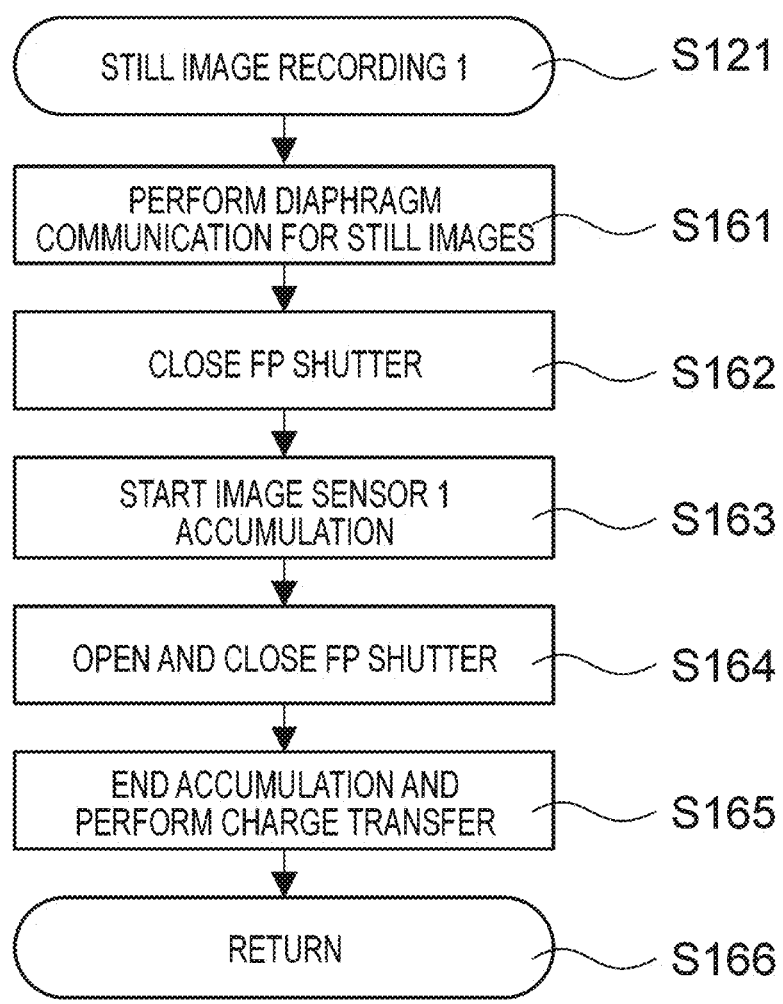
FIG. 14 is a flowchart illustrating a subroutine of "still image recording 1".

FIG. 14 is a flowchart of the "still image recording 1", and illustrates the subroutine executed in step S122 in FIG. 12. When the processing proceeds from step S122 to step S161, an F-number for still image recording is transmitted to the lens CPU 507 via the camera side communication terminal 113 and the lens side communication terminal 508. Upon receiving the F-number, the interchangeable lens 500 drive-controls the diaphragm driving unit 506, and controls the aperture diameter of the iris diaphragm to a value corresponding to the F-number for still image recording.

In step S162, a focal plane shutter in an open state for live view is once driven to be reset to a closed state.

In step S163, a charge accumulation operation for performing still image recording using the image sensor 101 is started.

In step S164, based on a shutter time for still image recording that has been calculated using a predetermined exposure calculation program, a leading curtain and a trailing curtain of the focal plane shutter are controlled to be driven, and a predetermined exposure amount is applied to the image sensor.

If the traveling of the focal plane shutter is completed, in step S165, the accumulation operation of the image sensor 101 ends, and charge transfer is performed. Then, in step S166, the processing returns to the main flow.

As described above, when still image recording is performed in a state in which the still image recording mode is selected, light amount adjustment is performed using the focal plane shutter, and light beams reaching the image sensor are shielded during charge transfer. With this configuration, the occurrence of smear and blooming can be avoided, so that a high-quality still image can be obtained.

Figure 15:
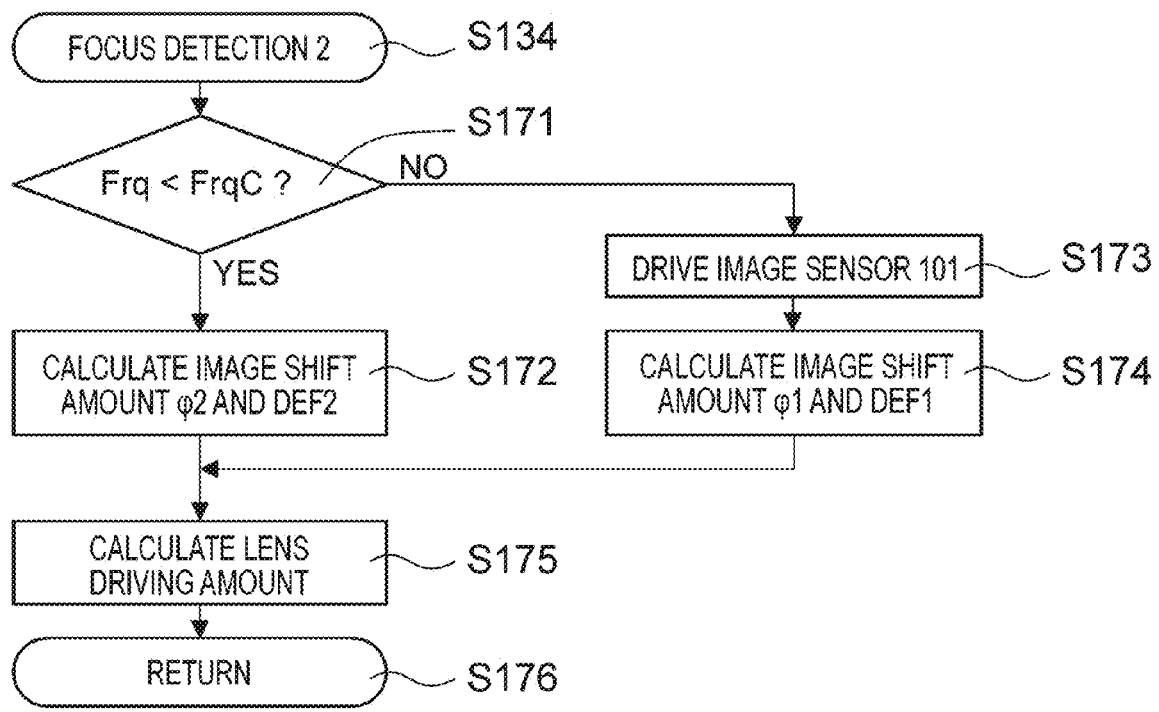
FIG. 15 is a flowchart illustrating a subroutine of "focus detection 2".

FIG. 15 is a flowchart of the "focus detection 2", and illustrates the subroutine executed in step S134 in FIG. 12.

When the processing proceeds from step S134 to step S171, the camera CPU 104 compares in size a spatial frequency (an average spatial frequency) Frq of the image acquired by the image sensor 102 and a predetermined spatial frequency FrqC that has been prespecified. Then, if the spatial frequency Frq of the acquisition image is a value smaller than the predetermined value FrqC (YES in step S171), the processing proceeds to step S172.

In step S172, the camera CPU 104 serving as a third control unit performs control so as to generate a pair of focus detection signals using signals acquired by the image sensor 102 for movies that is currently being used, and to calculate an image shift amount $\phi 2$ using a known correlation calculation algorithm. Then, the camera CPU 104 reads out a conversion coefficient 2 corresponding to the current F-number, from among the conversion coefficients listed in FIG. 11, and calculates a defocus amount DEF using the above-described Formula 17. Then, the processing proceeds to step S175. In step S175, the camera CPU 104 or the lens CPU 507 converts the defocus amount into a focus lens driving amount, and in step S176, the processing returns to the main flow.

On the other hand, in step S171, when the image sensor captures a subject image with higher spatial frequency, spatial aliasing (alias) may cause an error in the acquired signals. Thus, if the spatial frequency Frq of the acquisition image is equal to or larger than the predetermined value FrqC (NO in step S171), the processing proceeds to step S173. In step S173, the camera CPU 104 serving as the third control unit performs control so as to acquire signals from the image sensor 101 for still images having a small pixel pitch, and to use the acquired signals in focus detection. More specifically, the image sensor 101 is started, and pixel signals in a predetermined focus detection region are read out. Then, in step S174, a pair of focus detection signals is generated from the read-out pixel signals, and an image shift amount $\phi 1$ is calculated. Then, the camera CPU 104 reads out a conversion coefficient corresponding to the current F-number, from among the conversion coefficients listed in FIG. 11, and calculates a defocus amount DEF using the above-described Formula 17. Then, the processing proceeds to step S175. In step S175, the camera CPU 104 or the lens CPU 507 converts the defocus amount into a focus lens driving amount, and in step S176, the processing returns to the main flow.

In addition, in the flow according to the present exemplary embodiment, it has been described that, in the case of acquiring an image signal for recording or display using the image sensor 102 for movies, two image sensors are selectively used in focus detection according to the spatial frequency of the image. Nevertheless, regardless of which image sensor of the two image sensors is used for acquiring an image signal, the two image sensors can be selectively used in focus detection according to the spatial frequency of the image. For example, if the spatial frequency of the image is smaller than a predetermined value, that is, if spatial aliasing is unlikely to occur, the camera CPU 104 can perform control so as to perform focus detection using signals acquired by the image sensor 102 having a longer base length. As a result, focus detection can be performed with higher accuracy.

In addition, in the "focus detection 2", it has been described that the camera CPU 104 performs control so as to determine signals detected from which of the image sensors 101 and 102 are to be used in focus detection, according to the spatial frequency of the acquisition image acquired by the image sensor 102. Alternatively, control may be performed in such a manner as to determine which of the image sensors 101 and 102 is to be used in focus detection, depending on whether an image acquired by the image sensor 102 is a first image containing high-frequency components or a second image not containing high-frequency components. In this case, if the acquisition image contains high-frequency components of a predetermined level or higher, the acquisition image is determined to be the first image. If the acquisition image does not contain high-frequency components of the predetermined level or higher, the acquisition image is determined to be the second image. The camera CPU 104 serving as a fourth control unit performs control so as to use signals acquired from the image sensor 101 if the acquisition image is the first image, and to use signals acquired from the image sensor 102 if the acquisition image is the second image.

In this manner, even in focus detection in the movie recording mode, focus detection is performed using the image sensor 102 for movies that has a relatively large base length even with increased F-number, and the image sensor 101 for still images is not driven. Thus, the increase in power consumption can be suppressed. On the other hand, in the case of a high-frequency subject for which a focus detection error may become large, the image sensor 101 for still images is driven, and focus detection signals of the image sensor 101 are used. The focus detection accuracy is thereby maintained, and a high-definition movie that is constantly in focus can be obtained. In other words, the imaging apparatus has the above-described first and second power supply modes even in the movie recording mode.

Figure 16:
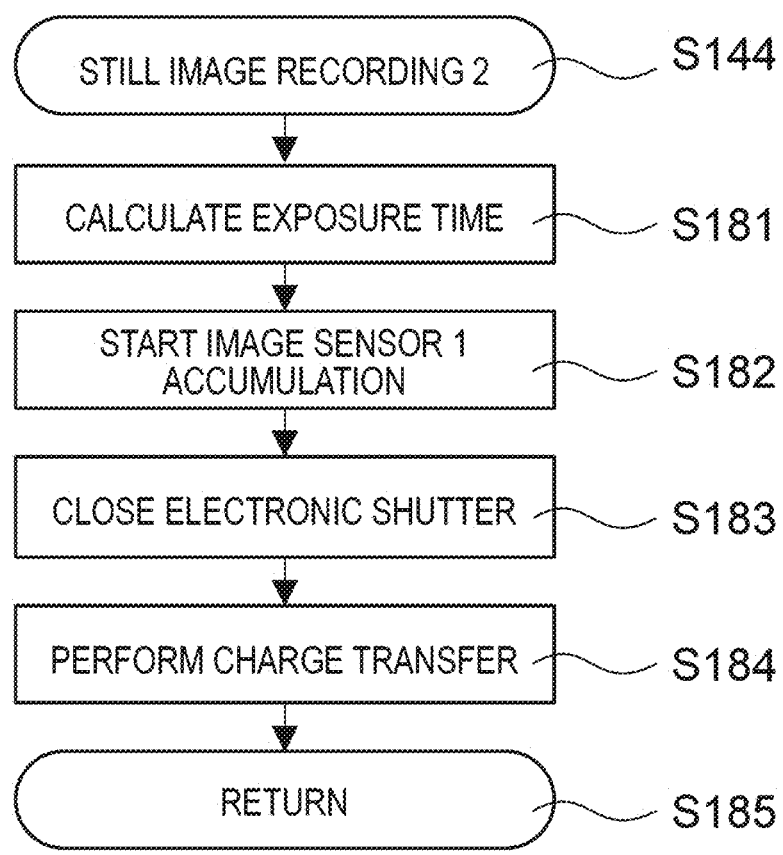
FIG. 16 is a flowchart illustrating a subroutine of "still image recording 2".

FIG. 16 is a flowchart of the "still image recording 2", and illustrates the subroutine executed in step S144 in FIG. 12.

At the time when the processing proceeds from step S144 to step S181, the focal plane shutter is in the open state, and the diaphragm of the imaging lens 500 is controlled to an F-number for movie recording. Thus, in step S181, an exposure time of the image sensor 101 for still images is calculated based on the F-number set at the time and the sensitivity set for the image sensor 101.

In step S182, while the focal plane shutter is remaining in the open state, the electronic shutter of the image sensor 101 is operated, and charge accumulation is started.

In step S183, after a predetermined time has elapsed, the electronic shutter is closed and the charge accumulation is ended. In step S184, charge transfer is performed, and in step S185, the processing returns to the main flow.

As described above, when still image recording is performed concurrently with movie recording in a state in which the movie recording mode is selected, the still image recording is performed using the F-number controlled in the movie recording mode. In addition, the focal plane shutter is not operated. Thus, the aperture diameter does not change unintentionally during the movie recording, and the operation sound of the focal plane shutter is not recorded. As a result, a still image can be obtained while continuing high-quality movie recording.

In addition, as described above, the base length GP1 of a pair of pupil regions in the image sensor 101 is shorter than the base length GP2 in the image sensor 102. In addition, the overlap amount of overlapped region RP1 of the pair of pupil regions in the image sensor 101 is larger than the overlap amount of overlapped region RP2 of the pair of pupil regions in the image sensor 102. The base lengths GP1 and GP2 shorten in accordance with the increase in F-number, and the decrease degree of the base length GP1 is more significant than that of the base length GP2. With this configuration, in the present exemplary embodiment, the base length of the pair of pupil regions in the image sensor 102 becomes longer than that in the image sensor 101 regardless of an F-number of the imaging lens 500. Nevertheless, this is not intended for preventing the overlap amount of overlapped region RP2 from becoming larger than the overlap amount of overlapped region RP1. In this case, when the diaphragm is in the open state, even though the base length in the image sensor 102 is longer than that in the image sensor 101, if an F-number is large and the pair of pupil regions is vignetted, the base length in the image sensor 101 may become longer than that in the image sensor 102. In this case, the camera CPU 104 may perform control so as to perform focus detection using the image sensor 101 when the base length in the image sensor 101 is longer than the base length in the image sensor 102, and to perform focus detection using the image sensor 102 when the base length in the image sensor 102 is longer than the base length in the image sensor 101. At this time, a predetermined F-number at which the relationship between the respective base lengths in the image sensors 101 and 102 is reversed may be stored in the camera CPU 104, and an image sensor to be used in focus detection may be switched according to the F-number. With this configuration, different focus detection characteristics of two image sensors can be selectively used according to the situations.

Furthermore, in step S151 in the flow of the "focus detection 1" in FIG. 13, the F-number of the imaging lens 500 serves as a selection standard of an image sensor to be used in focus detection during still image recording. Nevertheless, in the present exemplary embodiment, the selection standard is not limited to the F-number of the imaging lens 500. FIG. 17A illustrates an example of conditions for switching an image sensor to be used in focus detection during still image recording, from the image sensor 101 for still images to the image sensor 102 for movies. In FIG. 17A, Number 1 corresponds to the determination guideline described in the subroutine flow in FIG. 13. If the F-number Fn in focus detection is larger than the value of the predetermined F-number FnC, a focus detection result of the image sensor 102 is adopted even during still image recording.

Number 2 corresponds to an example of performing determination according to subject brightness. As described above with reference to FIGS. 2A to 2D, as for the size of pixel portions included in an image sensor, the pixel portions of the image sensor 102 for movies have larger aperture areas and higher sensitivity than those of the image sensor 101 for still images. Thus, when subject brightness is low, signals from the image sensor 102 for movies contain lower noise. Thus, when the subject brightness is lower than a predetermined value, a focus detection result of the image sensor 102 is adopted.

Number 3 corresponds to an example of performing determination according to whether continuous image capturing is performed. The continuous image capturing speed in the case of continuously capturing still images, i.e., a so-called continuous image capturing frame speed is lower than the frame rate of live view. A focus detection cycle therefore decreases accordingly. Thus, by performing focus detection using an image sensor for movies concurrently with continuous image capturing performed using an image sensor for still images, the decrease in the focus detection cycle can be avoided, and AF tracking capacity for moving subjects can be maintained.

In a similar manner, in step S171 in the flow of the "focus detection 2" in FIG. 15, the spatial frequency of an image for focus detection serves as a selection standard of an image sensor to be used in focus detection during movie recording. Nevertheless, in the present exemplary embodiment, the selection standard is not limited to the spatial frequency. FIG. 17B illustrates an example of conditions for switching an image sensor to be used in focus detection during movie recording, from the image sensor 102 for movies to the image sensor 101 for still images. In FIG. 17B, Number 1 corresponds to the determination guideline described in the subroutine flow in FIG. 15. If the spatial frequency Frq of a focus detection signal is larger than the value of the predetermined frequency FrqC, a focus detection result of an image sensor for still images is adopted even during movie recording.

Number 2 corresponds to an example of performing determination according to the contrast of the focus detection signal. As described above with reference to FIGS. 8A to 8D, an image sensor for movies has larger pupil regions and a longer base length as compared with those in an image sensor for still images. In view of these aspects, the contrast of a focus detection image acquired by the image sensor for movies easily declines in accordance with the increase in defocus amount. In addition, a relative shift amount between the A image and the B image is larger. Thus, focus detection is highly likely to become unavailable. For this reason, if a focus detection signal acquired by the image sensor for movies has low contrast and focus detection is determined to be unavailable, a focus detection result acquired by the image sensor for still images is adopted.

In the above-described first exemplary embodiment, the pixel size in the image sensor 101 for still images is smaller than that in the image sensor 102 for movies. In addition, in the image sensor 101, the focus position of the micro lens with respect to the photoelectric conversion units is deeper in the direction of the photoelectric conversion units with respect to the micro lens, that is, a focus shift amount is larger, as compared with the image sensor 102. In view of these aspects, the image sensor 101 includes pupil regions centered on image quality, and the image sensor 102 for movies includes pupil regions centered on focus detection performance. In addition, in both of the still image recording mode and the movie recording mode, image sensors are selectively used according to the focus detection performance of each image sensor. As a result, unnecessary increase in power consumption is avoided, and highly-accurate AF is enabled.

In addition, in the present exemplary embodiment, two image sensors can be selectively used in focus detection according to focus detection characteristics. The focus detection accuracy can be thereby enhanced. In addition, as compared with the case of selectively using, in a single image sensor including a plurality of types of pixel portions, the pixel portions in focus detection according to focus detection characteristics of the pixel portions, the image sensors according to the present exemplary embodiment that include a single type of pixels can maintain image quality.

As described above, in the present exemplary embodiment, by making a region in the above-described pair of pupil regions where the both pupil regions overlap with each other, even light beams that have entered the pixel portions after having passed through the center (optical axis) of the exit pupil EPL can be photoelectrically converted. As a result, image quality does not deteriorate even in a defocus image being out of focus.

In addition, the base length of the pupil regions AFPa1 and AFPb1 of the image sensor 101 according to the present exemplary embodiment is longer than the base length of the pupil regions AFPa2 and AFPb2 of the image sensor 102. In other words, base lengths of a pair of pupil regions are different from each other between two image sensors. Thus, by selectively using image sensors having different base lengths, overall focus detection accuracy can be enhanced.

Second Exemplary Embodiment

In the first exemplary embodiment, as illustrated in FIGS. 4A and 4B, by making the pixel size in the image sensor 101 for still images smaller than that in an image sensor for movies, and also shifting the focus position of the micro lens with respect to the photoelectric conversion units, the overlap between the pupil regions in the image sensor 101 for still images is made larger. In the second exemplary embodiment described below, characteristics similar to those in the first exemplary embodiment are obtained by providing a waveguide in a pixel portion of one image sensor. The shapes on the imaging plane of an image sensor 201 serving as a first image sensor and an image sensor 202 serving as a second image sensor according to the second exemplary embodiment are the same as those of the image sensors 101 and 102 illustrated in FIGS. 2A to 2D. In addition, the readout circuit configurations of the image sensors 201 and 202 are the same as that illustrated in FIG. 3. In addition, the structure of the image sensor 202 according to the second exemplary embodiment is the same as the structure of the image sensor 102 according to the first exemplary embodiment. Thus, the description of the parts having the same configurations will be omitted.

FIGS. 18A and 18B are diagrams illustrating the structures of pixel portions of the image sensor 201 and pupil regions according to the second exemplary embodiment. FIG. 18A corresponds to FIG. 4A in the first exemplary embodiment, and a pixel portion 201-1 is located at the center of an imaging region, i.e., on the optical axis of the imaging lens 500.

A photoelectric conversion unit 201a serving as a first photoelectric conversion unit and a photoelectric conversion unit 201b serving as a second photoelectric conversion unit are formed within a silicon substrate 201d forming a base body of a CMOS image sensor. In addition, a switching transistor (not illustrated) that converts photoelectrons generated in the photoelectric conversion units into voltage and reads out to the outside, and the like are formed. Output signals from the photoelectric conversion units are read out by wiring layers 201e. Each of the wiring layers 201e is insulated by a transparent interlayer film 201f. A color filter 201g for color separation is provided beneath an on-chip micro lens 201c. In the present exemplary embodiment, silicon dioxide with refractive index of approximately 1.5 is used for the interlayer film 201f, and a waveguide 201h made of silicon nitride with refractive index of approximately 2.0 is formed at the center portion of the interlayer film 201f. A planarizing layer 201j keeps the upper surfaces of the interlayer film 201f and the waveguide 201h flat, and has a function of separating the micro lens 201c and the waveguide 201h with a distance. FIG. 18A illustrates light rays entering parallel to the optical axis of the micro lens 201c. In the present exemplary embodiment, the focus position of the micro lens 201c is in the vicinity of the center in the height direction of the waveguide 201h.

FIG. 18B is a diagram illustrating a relationship between the imaging lens 500 and a pupil region between pixel portions, and corresponds to FIG. 7A in the first exemplary embodiment. FIG. 18B illustrates the exit pupil EPL of the imaging lens 500 and two pixel portions 201-1 and 201-2. The pixel portion 201-1 is a pixel portion disposed at the center of the imaging plane, i.e., at an image height x=0 mm, and the pixel 201-2 is a pixel portion disposed at a location closer to the end of the imaging plane, for example, at an image height x=10 mm. In the pixel portion 201-1, the optical axis of the micro lens 201c falls on the center of the pixel portion (the boundary portion of the pair of photoelectric conversion units). Via the micro lens 201c, a pair of reverse projection images corresponding to the pair of photoelectric conversion units 201a and 201b are projected at the same position as the exit pupil EPL with respect to the optical axis direction. Regions corresponding to the reverse projection images, i.e., pupil regions AFPa12 and AFPb12 serve as so-called focus detection pupils for phase difference detection. In other words, a base length GP12, which is a base length in phase difference detection, is a distance between centroids of a pair of pupil regions. The pair of pupil regions has an overlap amount of overlapped region RP12.

In this example, the base length GP12 of the pupil regions and the overlap amount of overlapped region RP12 are both different from the base length GP1 and the overlap amount of overlapped region RP1 in the first exemplary embodiment that are illustrated in FIG. 7A. Especially, in the second exemplary embodiment, the overlap amount of overlapped region RP12 is considerably larger than the overlap amount of overlapped region RP1 for the following reason. First, as described above, since the focus position of the micro lens 201c is in a considerably front focus state with respect to the upper surfaces of the photoelectric conversion units 201a and 201b, the pupil regions AFPa12 and AFPb12 are largely defocused, so that the trails of the pupil regions largely broaden. In addition, light rays that have reached the inner wall surfaces of the waveguide are totally reflected to advance within the waveguide. Thus, even light rays that have entered with larger angles with respect to the optical axis of the micro lens reach the photoelectric conversion units. For example, a straight line RYd is a light ray entering the pixel portion from a position shifted leftward from the center of the pupil region AFPa12 serving as a first pupil region. The light ray corresponding to the straight line RYd enters the waveguide 201h after having passed through a principal point of the micro lens 201c, and is totally reflected by the right wall surface of the waveguide 201h to reach near the boundary portion of the pair of photoelectric conversion units. In this manner, the rate at which light rays that should have originally entered the photoelectric conversion unit 201a enter the photoelectric conversion unit 201b increases. This brings about the effect of further increasing the out-of-focus amounts of the pupil regions, and the overlap amount of the pair of pupil regions accordingly increases.

Next, the pixel portion 201-2 will be described. Also in the pixel portion 201-2, similarly to the pixel portion 101-2 described with reference to FIG. 7A in the first exemplary embodiment, a micro lens 201c-o of the pixel portion 201-2 is decentered by a predetermined amount. Thus, a principal ray RYc-o of the pixel portion has inclination ω1 with respect to the optical axis, and intersects with the optical axis at a location distant from the imaging plane by a sensor pupil distance PDS1. In addition, a decentering amount of the micro lens of a pixel portion located between the pixel portions 201-1 and 201-2 is proportional to an image height x of the pixel portion. Thus, on the sensor pupil surface, pupil regions of all pixel portions substantially correspond to the pupil regions AFPa12 and AFPb12 of a pixel portion at the center of the imaging plane.

Figure 19A:
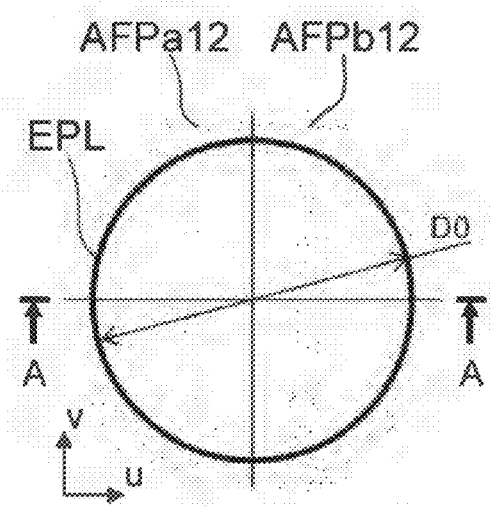
FIGS. 19A, 19B, 19C, and 19D are diagrams illustrating plane shapes and light-receiving efficiencies of pupil regions of the image sensors 201 and 202.
Figure 19C:
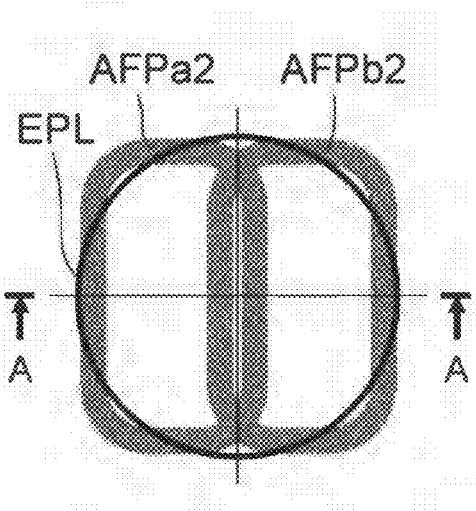
Figure 19B:
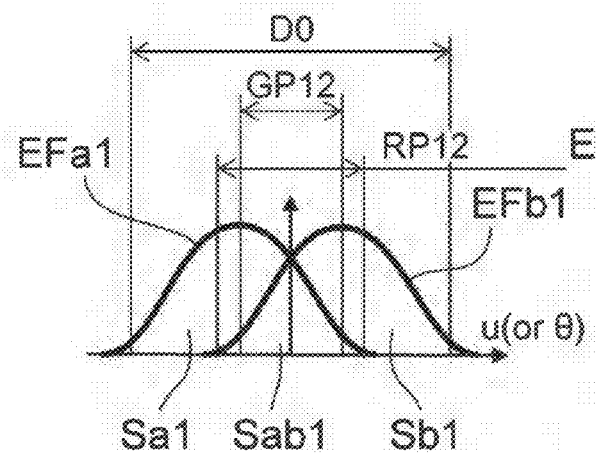
Figure 19D:
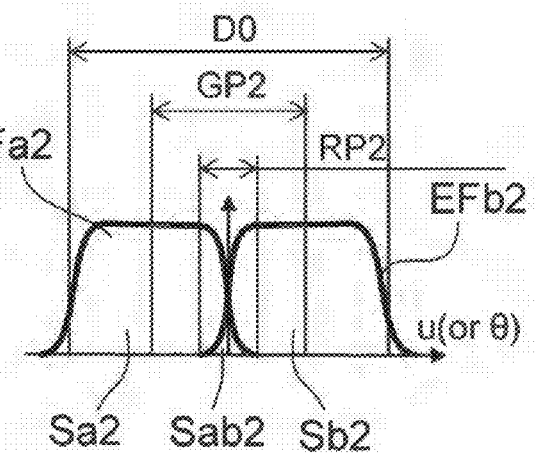

FIGS. 19A to 19D are diagrams illustrating the broadening and light-receiving characteristics of pupil regions in the image sensor according to the second exemplary embodiment, and correspond to FIGS. 8A to 8D in the first exemplary embodiment. FIGS. 19C and 19D are diagrams illustrating the characteristics of the image sensor 202, which are similar to the characteristics of the second image sensor according to the first exemplary embodiment. Thus, the description thereof will be omitted. FIG. 19A is a plan view of pupil regions on a sensor pupil surface of the image sensor 201 according to the second exemplary embodiment, and FIG. 19B is a diagram illustrating light-receiving characteristics of the pupil regions in the A-A cross section. As described above with reference to FIG. 18B, the outlines of the pair of pupil regions AFPa12 and AFPb12 are largely defocused to broaden, and the trails are overlapped by the overlap amount of overlapped region RP12. In addition, also in the second exemplary embodiment, the overlap amount of overlapped region RP12 of the pupil regions in the image sensor 201 is larger than the overlap amount of overlapped region RP2 of the pupil regions in the image sensor 202. That is, the following relationship is satisfied:

$$RP12 > RP2 \qquad \text{(Formula 18).}$$

In addition, when comparison is made using the area ratio of the overlap portion, the definition similar to that described above using FIG. 8B and Formula 11 is applied, and the overlap ratio of the pupil regions in the image sensor 201 is calculated to be SR12=0.3. Thus, the following relationship is maintained:

$$SR12 > SR2 \qquad \text{(Formula 19).}$$

In addition, focus detection characteristics, image capturing flows, focus detection subroutines, and the like of the imaging apparatus according to the second exemplary embodiment are basically the same as those in the first exemplary embodiment that have been described above with reference to FIGS. 10A to 17B. Thus, the description thereof will be omitted.

As described above, in the second exemplary embodiment, a waveguide is provided in the pixel portion of the image sensor 201, i.e., an image sensor for still images so that light rays entering the pixel portion with large angles with respect to the optical axis can also be captured using the total reflection function of the waveguide. With this configuration, the overlap of the pupil regions can be made larger, and the function and effect similar to those in the first exemplary embodiment can be obtained.

In addition, in the present exemplary embodiment, by installing the waveguide in the pixel portion of the image sensor 201, light focusing efficiency is enhanced. The enhancement in the light focusing efficiency of the image sensor 201 for still images enhances the image quality of an image to be acquired by the image sensor 201.

Third Exemplary Embodiment

In the following third exemplary embodiment, by employing a so-called rear surface irradiation type CMOS image sensor as one image sensor, and employing a front surface irradiation type CMOS image sensor as the other image sensor similarly to the above-described exemplary embodiments, the characteristics similar to those in the first and second exemplary embodiments are obtained. The shapes on the imaging plane of an image sensor 301 serving as a first image sensor and an image sensor 302 serving as a second image sensor according to the third exemplary embodiment are the same as those illustrated in FIGS. 2A to 2D. In addition, the readout circuit configuration of each image sensor is the same as that illustrated in FIG. 3. In addition, the structure of the image sensor 302 according to the third exemplary embodiment is the same as the structure of the image sensor 102 according to the first exemplary embodiment. Thus, the description of the parts having the same configurations will be omitted.

FIGS. 20A and 20B are diagrams illustrating the structures of pixel portions of the image sensor 301 and pupil regions according to the third exemplary embodiment. FIG. 20A corresponds to FIG. 4A in the first exemplary embodiment, and a pixel portion 301-1 is located at the center of an imaging region, i.e., on the optical axis of the imaging lens 500.

A silicon substrate 301d forms a base body of a CMOS image sensor, and a photoelectric conversion unit 301a serving as a first photoelectric conversion unit and a photoelectric conversion unit 301b serving as a second photoelectric conversion unit are formed within the silicon substrate 301d. In addition, a switching transistor (not illustrated) that converts photoelectrons generated in the photoelectric conversion units into voltage and reads out to the outside, and the like are formed. Output signals from the photoelectric conversion units are read out by wiring layers 301e. Each of the wiring layers 301e is insulated by an interlayer film 301f. Since the image sensor 301 is a rear surface irradiation type CMOS image sensor, in the present exemplary embodiment, the wiring layers 301e and the interlayer film 301f are formed on the surface of the pair of photoelectric conversion units that is opposite to the incident side of imaging light beams. The photoelectric conversion units, the wiring layers 301e, and the interlayer film 301f are formed on the silicon substrate 301d, and the surface of the silicon substrate 301d that is opposite to a wiring layer formation portion is removed by chemical polishing. Then, a planarizing layer 301j with a predetermined thickness is formed. A color filter 301g for color separation is provided on the planarizing layer 301j, and an on-chip micro lens 301c is then formed. The planarizing layer 301j keeps the light beam incidence planes of the photoelectric conversion units flat, and has a function of keeping a distance between the photoelectric conversion units and the micro lens 301c at a predetermined value. Since the rear surface irradiation type CMOS image sensor does not include wiring layers between the micro lens for light focusing and the photoelectric conversion units, the height of a portion where light beams exist becomes lower as compared with that in a front surface irradiation type CMOS image sensor. Thus, while the light usage efficiency of each pixel portion becomes higher, the focus position of the micro lens becomes considerably deeper in a lower direction than the upper surfaces of the photoelectric conversion units.

FIG. 20B is a diagram illustrating a relationship between the imaging lens 500 and a pupil region between pixel portions, and corresponds to FIG. 7A in the first exemplary embodiment. FIG. 20B illustrates the exit pupil EPL of the imaging lens 500, and two pixel portions 301-1 and 301-2. The pixel portion 301-1 is a pixel portion disposed at the center of the imaging plane, i.e., at an image height x=0 mm, and the pixel 301-2 is a pixel portion disposed at a location closer to the end of the imaging plane, for example, at an image height x=10 mm. In the pixel portion 301-1, the optical axis of the micro lens 301c falls on the center of the pixel portion (the boundary portion of the pair of photoelectric conversion units). Via the micro lens 301c, a pair of reverse projection images corresponding to the pair of photoelectric conversion units 301a and 301b are projected at the same position as the exit pupil EPL with respect to the optical axis direction. Regions corresponding to the pair of reverse projection images, i.e., pupil regions AFPa13 and AFPb13 serve as so-called focus detection pupils for phase difference detection.

Also in the present exemplary embodiment, the overlap amount of the pair of pupil regions in the image sensor 301 serving as the first image sensor is larger than the overlap amount of the pair of pupil regions in the image sensor 302 serving as the second image sensor. Similarly to the case of the first exemplary embodiment, the reason why the overlap amount in the image sensor 301 is larger than that in the image sensor 302 lies in the fact that an out-of-focus amount of each pupil region in the image sensor 301 is larger than that in the image sensor 302.

As described above, in the image sensor 301, the focus position of the micro lens is deeper in the direction of the photoelectric conversion units with respect to the micro lens, i.e., is in a back focus state, as compared with that in the image sensor 302. As a result, in the image sensor 301, an optically conjugate state of the exit pupil EPL and the upper surfaces of the photoelectric conversion units is canceled, so that the pupil regions are defocused. In addition, the reason why the pupil regions are defocused by causing the focus position of the micro lens to be in a back focus state is as described in the first exemplary embodiment.

Reverse projection images of the photoelectric conversion units of the image sensor 301 that are reversely projected at the exit pupil EPL also have a three dimensional shape extending also in the z-axis direction more than that in the case of the image sensor 302. Thus, the reverse projection images are more defocused than those in the case of the image sensor 302. In other words, in a similar manner, the corresponding pupil regions AFPa13 and AFPb13 of the image sensor 301 also become regions extending in the z-axis direction more than pupil regions AFPa23 and AFPb23 (not illustrated) of the image sensor 302. With this configuration, in the image sensor 301, the out-of-focus amounts of the pupil regions become larger than those in the image sensor 302.

For the above-described reason, the out-of-focus amounts of the pupil region AFPa13 and AFPb13 of the image sensor 301 are larger than those of the pupil regions AFPa23 and AFPb23 of the image sensor 302. Thus, the overlap amount of overlapped region RP in the image sensor 301 is larger than that in the image sensor 302.

A base length GP13, which is a base length in phase difference detection, is a distance between centroids of a pair of pupil regions. The pair of pupil regions has an overlap region with an overlap amount of overlapped region RP13.

Next, the pixel portion 301-2 will be described. Also in the pixel portion 301-2, similarly to the pixel portion 101-2 described with reference to FIG. 7A in the first exemplary embodiment, a micro lens 301c-o of the pixel portion 301-2 is decentered by a predetermined amount. Thus, a principal ray RYc-o of the pixel portion has inclination ω1 with respect to the optical axis, and intersects with the optical axis at a location distant from the imaging plane by a sensor pupil distance PDS1. In addition, a decentering amount of the micro lens of a pixel portion located between the pixel portions 301-1 and 301-2 is proportional to an image height x of the pixel portion. Thus, on the sensor pupil surface, pupil regions of all pixel portions substantially correspond to the pupil regions AFPa13 and AFPb13 of a pixel portion at the center of the imaging plane.

The base length GP13 and the overlap amount of overlapped region RP13 of the pupil regions in the third exemplary embodiment depend on the shape of the micro lens 301c and the thickness of the planarizing layer 301j. In the present exemplary embodiment, the base length GP13 and the overlap amount of overlapped region RP13 have characteristics substantially similar to the characteristics according to the second exemplary embodiment that are illustrated in FIG. 18B. The broadening and light-receiving characteristics of the pupil regions accordingly have characteristics similar to the characteristics according to the second exemplary embodiment that are illustrated in FIGS. 19A to 19D. Thus, the detailed description thereof will be omitted.

As described above, in the third exemplary embodiment, a rear surface irradiation type CMOS image sensor is employed as the first image sensor, i.e., the image sensor 301 for still images. By adjusting light focusing characteristics of the micro lens and the height of the pixel portions, the overlap of pupil regions can be made larger, so that the function and effect similar to those in the first exemplary embodiment can be obtained. In addition, in the rear surface irradiation type CMOS image sensor, light entering each pixel portion is not shielded by wiring layers. It is therefore known that light with larger amount can be received. By employing a rear surface irradiation type CMOS image sensor as the image sensor 301 for still images, the enhancement in image quality of still images can be expected.

Modified Example

In the first to third exemplary embodiments described above, each pixel in each image sensor includes a pair of photoelectric conversion units arranged in the x direction, the exit pupil of the imaging lens 500 is divided in the x direction, and a phase difference in subject image in the x direction is detected. In contrast, each pixel of an image sensor can be formed of 2×2 in the x and y directions along the imaging plane, i.e., 4 photoelectric conversion units in total. With this configuration, phase difference detection can be performed in a desired direction of the x and y directions or both directions according to the directionality of a contrast pattern of a subject image. In this case, while each pixel in the image sensor is formed of two pairs of photoelectric conversion units, phase difference detection can be performed by selecting predetermined two photoelectric conversion units from among the 4 photoelectric conversion units, and handling the selected two photoelectric conversion units as a pair of photoelectric conversion units. Alternatively, a pair of signals may be obtained by adding the outputs from two photoelectric conversion units adjacent in the y direction. In addition, also in this modified example, the overlap of a pair of pupil regions has characteristics similar to the characteristics described in the first to third exemplary embodiments. It is therefore possible to obtain the effect similar to that in each exemplary embodiment.

According to the disclosure, an imaging apparatus that can acquire an image signal for high-quality recording and a focus detection signal for high accuracy detection from each of two image sensors can be obtained.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-109420, filed May 29, 2015, which is hereby incorporated by reference herein in its entirety.

What is claimed is:
1. An imaging apparatus comprising:
   a light beam splitter configured to split a light beam having passed through an exit pupil of an imaging lens, into a first light beam and a second light beam;
   a first image sensor including a plurality of micro lenses and configured to receive the first light beam; and
   a second image sensor including a plurality of micro lenses and configured to receive the second light beam, wherein the first image sensor includes a plurality of pixel portions, each pixel portion of the plurality of pixel portions includes one micro lens, and a first photoelectric conversion unit and a second photoelectric conversion unit that form a pair of photoelectric conversion units, and a first pupil region, through which a third light beam received by the first photoelectric conversion unit passes, and a second pupil region, through which a fourth light beam received by the second photoelectric conversion unit passes, are overlapped with each other, wherein the second image sensor includes a plurality of pixel portions, each pixel portion of the plurality of pixel portions includes one micro lens, and a third photoelectric conversion unit and a fourth photoelectric conversion unit that form a pair of photoelectric conversion units, and a third pupil region, through which a fifth light beam received by the third photoelectric conversion unit passes, and a fourth pupil region, through which a sixth light beam received by the fourth photoelectric conversion unit passes, are overlapped with each other, and wherein a distance between centroids of the third pupil region and the fourth pupil region is longer than a distance between centroids of the first pupil region and the second pupil region.

2. The imaging apparatus according to claim 1,
wherein the first image sensor and the second image sensor are on an image forming plane optically conjugate with respect to a subject, via an imaging lens.

3. The imaging apparatus according to claim 2,
wherein a diameter of the exit pupil is longer than the distance between the centroids of the third pupil region and the fourth pupil region, and the distance between the centroids of the first pupil region and the second pupil region.

4. The imaging apparatus according to claim 3,
wherein an overlap ratio of an overlap portion of the first pupil region and the second pupil region is larger than an overlap ratio of an overlap portion of the third pupil region and the fourth pupil region.

5. The imaging apparatus according to claim 4,
wherein a ratio of an area of a region of an overlap portion of regions surrounded by respective light-receiving efficiency curves of a pair of pupil regions, with respect to an area obtained by adding areas of the regions surrounded by the respective light-receiving efficiency curves of the pair of pupil regions and dividing the obtained area by 2 is an overlap ratio, and wherein, the light-receiving efficiency curves of the pair of pupil regions are curves representing light-receiving efficiencies of the pair of pupil regions, viewed in a cross section passing through a line connecting centroids of the pair of pupil regions.

6. The imaging apparatus according to claim 4,
wherein a focus position of a micro lens in the first image sensor is at a position deeper in a direction of the photoelectric conversion units with respect to the micro lens, than a focus position of a micro lens in the second image sensor.

7. The imaging apparatus according to claim 4,
wherein the first image sensor includes a waveguide between the micro lens and the pair of photoelectric conversion units, and the second image sensor does not include a waveguide.

8. The imaging apparatus according to claim 4,
wherein the first image sensor is a rear surface irradiation type CMOS image sensor, and the second image sensor is a front surface irradiation type CMOS image sensor.

9. The imaging apparatus according to claim 4, further comprising
a focus detection unit configured to perform focus detection using a signal acquired from at least either one of the first image sensor and the second image sensor,
wherein the imaging apparatus includes a second control unit configured to perform control so as to acquire a signal from either the first or second image sensor and selectively use the acquired signal in focus detection, according to an F-number of the imaging lens, and
wherein, in a case in which an image signal is acquired by the first image sensor, the second control unit performs control so as to perform focus detection using a signal acquired from the first image sensor, in a case in which an F-number of the imaging lens is a first F-number smaller than a predetermined value, and to perform focus detection using a signal acquired from the second image sensor, in a case in which an F-number of the imaging lens is a second F-number equal to or larger than the predetermined value.

10. The imaging apparatus according to claim 9, further comprising
an addition control unit configured to add signals of the pair of photoelectric conversion units in the first image sensor and the second image sensor,
wherein the addition control unit generates a signal for recording or display by adding signals of the pair of photoelectric conversion units, and
wherein the focus detection unit performs focus detection using each of the signals of the pair of photoelectric conversion units.

11. The imaging apparatus according to claim 10,
wherein the number of pixels in the first image sensor is larger than that in the second image sensor,
wherein the imaging apparatus includes a first generation unit configured to generate an image signal for a still image from the first image sensor, and a second generation unit configured to generate an image signal for a movie from the second image sensor, and
wherein the imaging apparatus includes a first control unit configured to perform control so that the first generation unit and the second generation unit concurrently generate image signals.

12. The imaging apparatus according to claim 11,
wherein respective areas of the plurality of photoelectric conversion units included in the first image sensor are smaller than respective areas of the plurality of photoelectric conversion units included in the second image sensor.

13. The imaging apparatus according to claim 10,
wherein the imaging apparatus has a first power supply mode in which power is selectively supplied to either the first or second image sensor, and a second power supply mode in which power is supplied to both of the first and second image sensors.

14. The imaging apparatus according to claim 4,
wherein respective areas of the plurality of photoelectric conversion units included in the first image sensor are smaller than respective areas of the plurality of photoelectric conversion units included in the second image sensor,
wherein the imaging apparatus includes a focus detection unit configured to perform focus detection using a signal acquired from at least either one of the first image sensor and the second image sensor, and wherein the imaging apparatus includes a third control unit configured to perform control so as to acquire a signal from either the first or second image sensor and selectively use the acquired signal in focus detection, according to a spatial frequency of an acquired image.

15. The imaging apparatus according to claim 14, wherein the third control unit performs control so as to perform focus detection using a signal acquired from the second image sensor, in a case in which the spatial frequency of an image acquired from the first or second image sensor is smaller than a predetermined value, and to perform focus detection using a signal acquired from the first image sensor, in a case in which the spatial frequency is equal to or larger than the predetermined value.

16. The imaging apparatus according to claim 15, wherein the imaging apparatus includes an addition control unit configured to add signals of the pair of photoelectric conversion units in the first image sensor and the second image sensor, wherein the addition control unit generates a signal for recording or display by adding signals of the pair of photoelectric conversion units, and wherein the focus detection unit performs focus detection using each of the signals of the pair of photoelectric conversion units.

17. The imaging apparatus according to claim 16, wherein the number of pixels in the first image sensor is larger than that in the second image sensor, wherein the imaging apparatus includes a first generation unit configured to generate an image signal for a still image from the first image sensor, and a second generation unit configured to generate an image signal for a movie from the second image sensor, and wherein the imaging apparatus includes a first control unit configured to perform control so that the first generation unit and the second generation unit concurrently generate image signals.

18. The imaging apparatus according to claim 16, further comprising a first power supply mode in which power is selectively supplied to either the first or second image sensor, and a second power supply mode in which power is supplied to both of the first and second image sensors.

19. The imaging apparatus according to claim 4, wherein respective areas of the plurality of photoelectric conversion units included in the first image sensor are smaller than respective areas of the plurality of photoelectric conversion units included in the second image sensor, wherein the imaging apparatus includes a focus detection unit configured to perform focus detection using a signal acquired from at least either one of the first image sensor and the second image sensor, and wherein the imaging apparatus includes a fourth control unit configured to perform control so as to perform focus detection using a signal acquired from the first image sensor, in a case in which an image acquired by the second image sensor is a first image containing a high-frequency component of a predetermined level or higher, and to perform focus detection using a signal acquired from the second image sensor, in a case in which the image is a second image not containing a high-frequency component of the predetermined level or higher.

20. The imaging apparatus according to claim 19, wherein the imaging apparatus includes an addition control unit configured to add signals of the pair of photoelectric conversion units in the first image sensor and the second image sensor, wherein the addition control unit generates a signal for recording or display by adding signals of the pair of photoelectric conversion units, and wherein the focus detection unit performs focus detection using each of the signals of the pair of photoelectric conversion units.

21. The imaging apparatus according to claim 20, wherein the number of pixels in the first image sensor is larger than that in the second image sensor, wherein the imaging apparatus includes a first generation unit configured to generate an image signal for a still image from the first image sensor, and a second generation unit configured to generate an image signal for a movie from the second image sensor, and wherein the imaging apparatus includes a first control unit configured to perform control so that the first generation unit and the second generation unit concurrently generate image signals.

22. The imaging apparatus according to claim 20, further comprising a first power supply mode in which power is selectively supplied to either the first or second image sensor, and a second power supply mode in which power is supplied to both of the first and second image sensors.

23. An imaging apparatus comprising:

a light beam splitter configured to split a light beam having passed through an imaging lens, into a plurality of light beams;

a first image sensor configured to receive one of the light beams divided by the light beam splitter; and a second image sensor configured to receive another one of the light beams divided by the light beam splitter, wherein the first and second image sensors each include a plurality of micro lenses, and includes a pair of photoelectric conversion units that corresponds to a corresponding one of the micro lenses, and wherein an angle formed by lines connecting a predetermined point of each micro lens and respective centroids of the pair of photoelectric conversion units for receiving light having passed through the corresponding micro lens varies between the first image sensor and the second image sensor.

24. The imaging apparatus according to claim 23, wherein the predetermined point is a planned image-forming position of each micro lens.

25. An imaging apparatus comprising:

a light beam splitter configured to split a light beam having passed through an imaging lens, into a plurality of light beams;

a first image sensor including a plurality of micro lenses and configured to receive one of the divided light beams; and a second image sensor including a plurality of micro lenses and configured to receive another one of the divided light beams, wherein each pixel portion included in the first and second image sensors includes a pair of photoelectric conversion units that corresponds to a corresponding one of the micro lenses, wherein, in each of the first image sensor and the second image sensor, a light beam received by one photoelectric conversion unit of the pair of photoelectric conversion units, and a light beam received by another photoelectric conversion unit partially overlap with each other, and wherein a distance between a point in a region of an exit pupil, through which a principal ray of the light beam received by the one photoelectric conversion unit passes, and a point in a region of an exit pupil, through which a principal ray of the light beam received by the other photoelectric conversion unit passes, varies between the first image sensor and the second image sensor.

* * * * *